United States Patent
Wang et al.

(10) Patent No.: US 11,121,006 B2
(45) Date of Patent: Sep. 14, 2021

(54) SEMICONDUCTOR PACKAGE COMPRISING MOLDING COMPOUND HAVING EXTENDED PORTION AND MANUFACTURING METHOD OF SEMICONDUCTOR PACKAGE

(71) Applicant: Taiwan Semiconductor Manufacturing Co., Ltd., Hsinchu (TW)

(72) Inventors: Po-Han Wang, Hsinchu (TW); Hung-Jui Kuo, Hsinchu (TW); Yu-Hsiang Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/734,421

(22) Filed: Jan. 6, 2020

(65) Prior Publication Data

US 2020/0144080 A1    May 7, 2020

Related U.S. Application Data

(62) Division of application No. 15/964,092, filed on Apr. 27, 2018, now Pat. No. 10,529,593.

(51) Int. Cl.
| | | |
|---|---|---|
| H01L 21/56 | (2006.01) | |
| H01L 23/31 | (2006.01) | |
| H01L 23/367 | (2006.01) | |
| H01L 23/04 | (2006.01) | |
| H01L 25/00 | (2006.01) | |
| H01L 21/48 | (2006.01) | |
| H01L 25/065 | (2006.01) | |
| H01L 23/498 | (2006.01) | |

(52) U.S. Cl.
CPC .......... *H01L 21/568* (2013.01); *H01L 21/481* (2013.01); *H01L 21/4871* (2013.01);
(Continued)

(58) Field of Classification Search
CPC ............. H01L 21/568; H01L 23/49822; H01L 25/0655; H01L 21/481; H01L 21/4871;
(Continued)

(56) References Cited

U.S. PATENT DOCUMENTS 7,129,585 B2 * 10/2006 Yoo ........................ H01L 21/563
257/778
8,193,647 B2 *  6/2012 Hsieh ...................... H01L 24/96
257/797

(Continued)

*Primary Examiner* — Mohammad M Hoque
(74) *Attorney, Agent, or Firm* — JCIPRNET

(57) ABSTRACT

A semiconductor package and a manufacturing method of a semiconductor package are provided. The semiconductor package includes a device die, a redistribution structure, a heat dissipation module and a molding compound. The redistribution structure is disposed at a front side of the device die. The heat dissipation module includes a thermal interfacial layer and a metal lid. The thermal interfacial layer is in direct contact with a back side of the device die, and located between the device die and the metal lid. The molding compound is disposed between the redistribution structure and the heat dissipation module, and has a body portion and an extended portion. The device die is located in the extended portion. The body portion laterally surrounds the extended portion. The extended portion is thicker than the body portion.

20 Claims, 28 Drawing Sheets

(52) U.S. Cl.
 CPC .......... *H01L 23/04* (2013.01); *H01L 23/3128* (2013.01); *H01L 23/367* (2013.01); *H01L 23/49822* (2013.01); *H01L 25/0655* (2013.01); *H01L 25/50* (2013.01)

(58) Field of Classification Search
 CPC ... H01L 23/04; H01L 23/367; H01L 23/3128; H01L 25/50
 USPC ........................................................ 257/668
 See application file for complete search history.

(56) References Cited

U.S. PATENT DOCUMENTS

| | | | |
|---|---|---|---|
| 9,368,469 B2* | 6/2016 | Nakatani | H01L 24/27 |
| 10,520,761 B2* | 12/2019 | Maeda | H01L 21/32139 |
| 2011/0018124 A1* | 1/2011 | Yang | H01L 21/6835 257/698 |
| 2013/0140713 A1* | 6/2013 | Yu | H01L 23/544 257/782 |
| 2014/0179103 A1* | 6/2014 | Kang | H01L 21/7684 438/667 |
| 2015/0187704 A1* | 7/2015 | Yoo | H01L 21/0272 438/455 |
| 2015/0189763 A1* | 7/2015 | Schrittwieser | H01L 24/82 361/761 |
| 2015/0235990 A1* | 8/2015 | Cheng | H01L 25/03 257/712 |
| 2017/0162550 A1* | 6/2017 | Das | H01L 23/5329 |
| 2017/0330741 A1* | 11/2017 | Inoue | H01L 24/20 |
| 2017/0365534 A1* | 12/2017 | Machida | H01L 24/19 |
| 2018/0166416 A1* | 6/2018 | Op de Beeck | H01L 29/0657 |

* cited by examiner

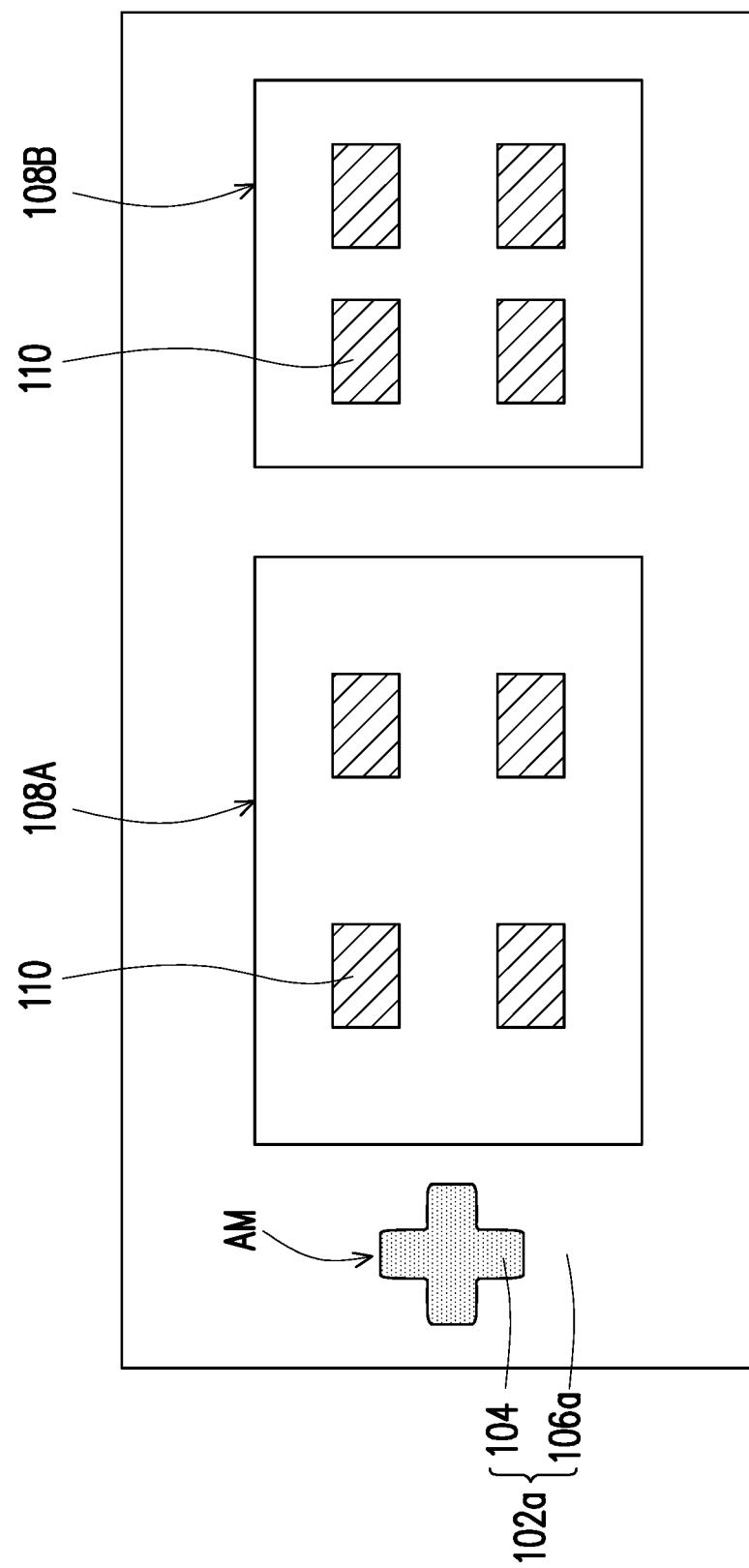

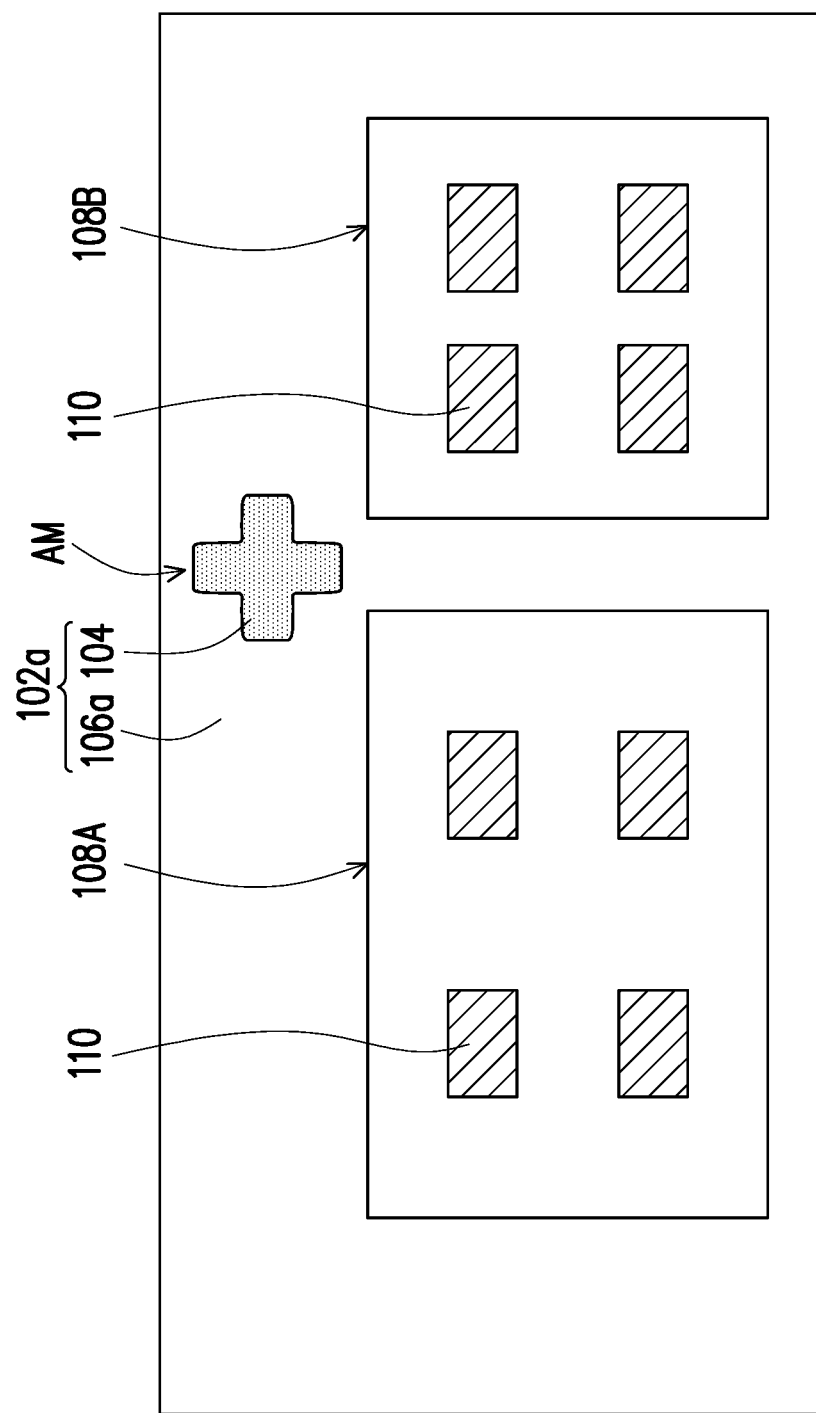
FIG. 2C"

SEMICONDUCTOR PACKAGE COMPRISING MOLDING COMPOUND HAVING EXTENDED PORTION AND MANUFACTURING METHOD OF SEMICONDUCTOR PACKAGE

CROSS-REFERENCE TO RELATED APPLICATION

This application is a divisional application of and claims the priority benefit of a prior application Ser. No. 15/964,092, filed on Apr. 27, 2018. The entirety of each of the above-mentioned patent applications is hereby incorporated by reference herein and made a part of this specification.

BACKGROUND

High-power device dies usually need effective heat dissipation paths. As electronic products are continuously miniaturized, heat dissipation of the packaged device die(s) has become an important issue for packaging technology. In addition, for multi-die packages, the arrangement of the dies and the corresponding connecting elements has impacts on the reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2C' is a schematic top view of the intermediate structure shown in FIG. 2C.

FIG. 2C" is a schematic top view illustrating an arrangement of semiconductor dies and an opening of the adhesive pattern according to some embodiments of the present disclosure.

DESCRIPTION OF THE EMBODIMENTS

Figure 1:
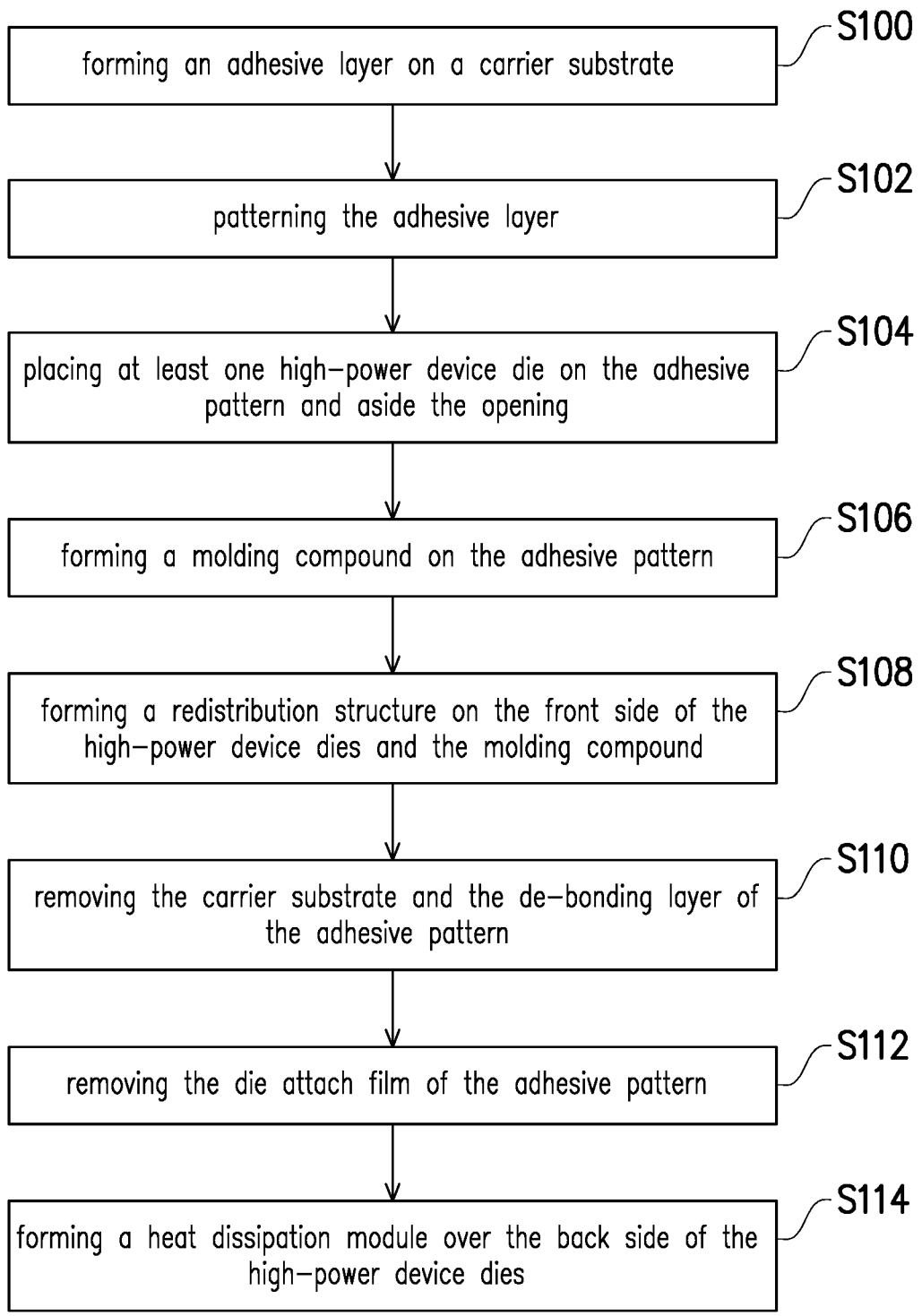
FIG. 1 is an exemplary flow chart showing the process steps of a manufacturing method of semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is an exemplary flow chart showing the process steps of a manufacturing method of a semiconductor package 10 according to some embodiments of the present disclosure. FIG. 2A through FIG. 2G are schematic cross-sectional views illustrating intermediate structures and package structures at various stages according to the manufacturing method of the semiconductor package 10 according to some embodiments of the present disclosure.

Figure 2A:
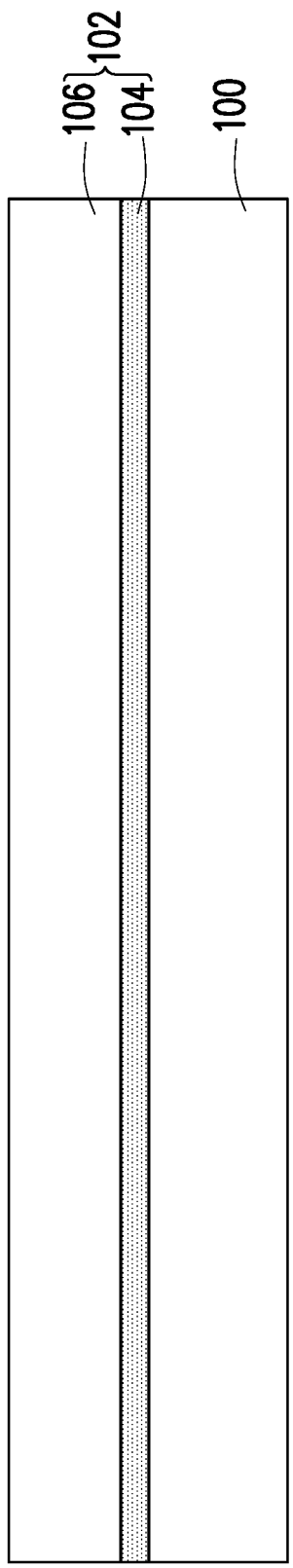
FIG. 2A through FIG. 2G are schematic cross-sectional views illustrating intermediate structures and package structures at various stages according to the manufacturing method of semiconductor package shown in FIG. 1.

Referring to FIG. 1 and FIG. 2A, step S100 is performed, and an adhesive layer 102 is formed on a provided carrier substrate 100. In some embodiments, the carrier substrate 100 is a glass substrate. The adhesive layer 102 may include a de-bonding layer 104 and a die attach film 106, which are sequentially formed on the carrier substrate 100. For example, the de-bonding layer 104 may be a light-to-heat conversion (LTHC) layer or a thermal release layer. In some embodiments, the die attach film 106 is a photo-sensitive die attach film. For instance, a material of the die attach film 106 may include epoxy resin, phenol resin, acrylic rubber, silica filler, a combination thereof or the like.

Figure 2B:
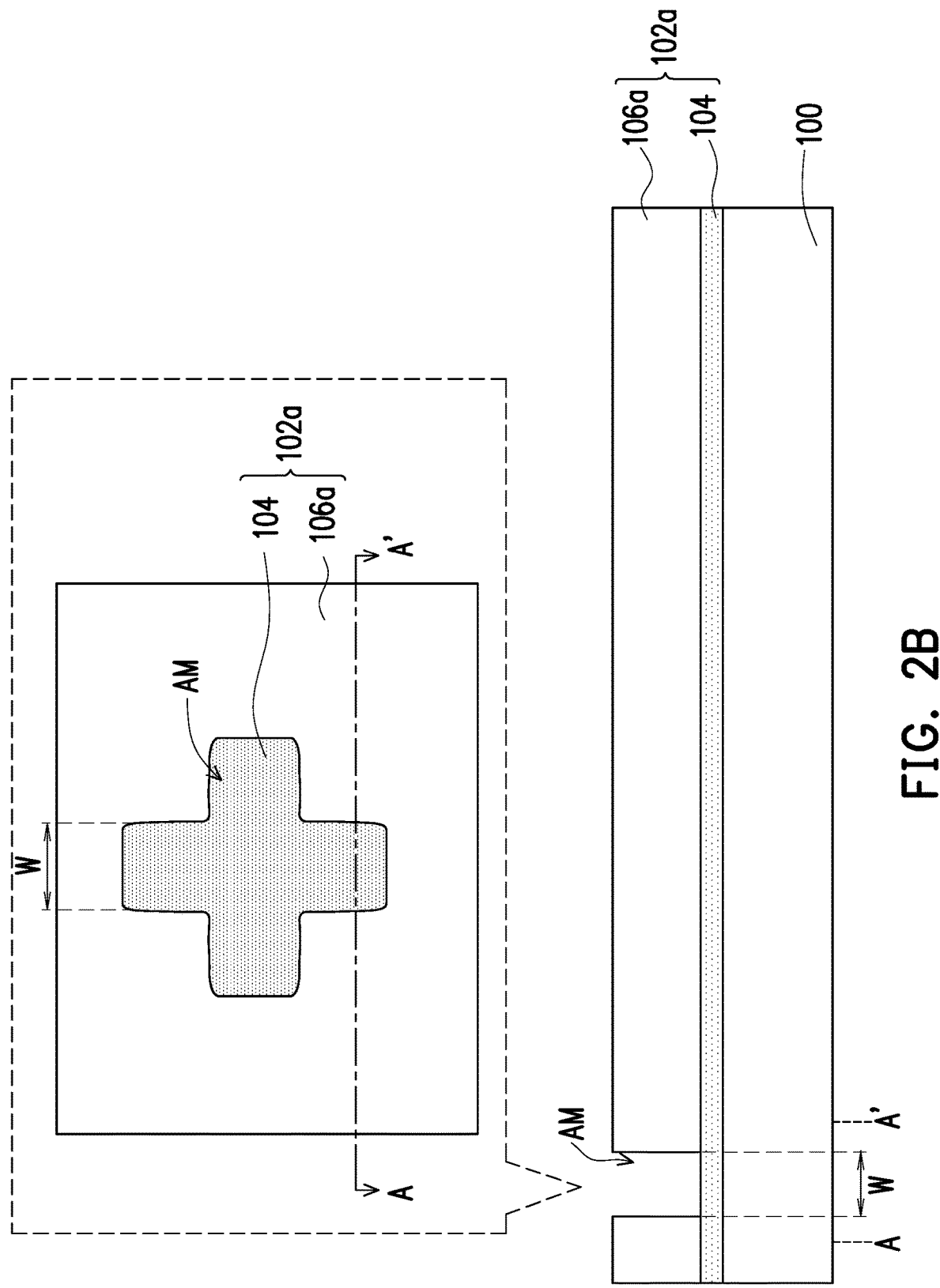

Referring to FIG. 1 and FIG. 2B, step S102 is performed, and the adhesive layer 102 is patterned. In some embodiments, the die attach film 106 of the adhesive layer 102 is patterned to form a die attach pattern 106a having an opening AM therein. In these embodiments, the die attach pattern 106a and the de-bonding layer 104 are collectively referred as an adhesive pattern 102a. In some embodiments, the opening AM may be formed in a device region, such that the opening AM would not be cut off but still remain in the semiconductor package after the singulation process has been performed. In certain embodiments, the opening AM is located in a peripheral part of the device region, i.e., located beside the die-disposing central part of the device region but not located within the scribe line region, and spaced from the desired locations of the subsequently disposed die(s) with a distance. The region enclosed by a dash line in FIG. 2B shows an enlarged schematic top view of the adhesive pattern 102a. In some embodiments, from the top view, the opening AM may be formed as a hollow cross or in a cross shape. A line width W of the cross-shaped opening AM may range from 10 μm to 100 μm. It is understood that the line width or the size of the opening may be tuned according to the material or thickness of the adhesive layer and/or the die attach film. In alternative embodiments, from the top view, the shape of the opening AM may include a cross shape, a circular shape, a polygonal shape or a combination thereof. As such, the opening AM can be served as an alignment mark during subsequently performed steps. It is understood that the shape(s), the pattern or the size of the alignment mark may be modified or adjusted according to the alignment requirements of the manufacturing processes.

In alternative embodiments, the opening AM may be formed in a scribe line region (not shown) of the semiconductor package 10, such that the opening AM would be removed after a singulation process has been performed.

Figure 2C:
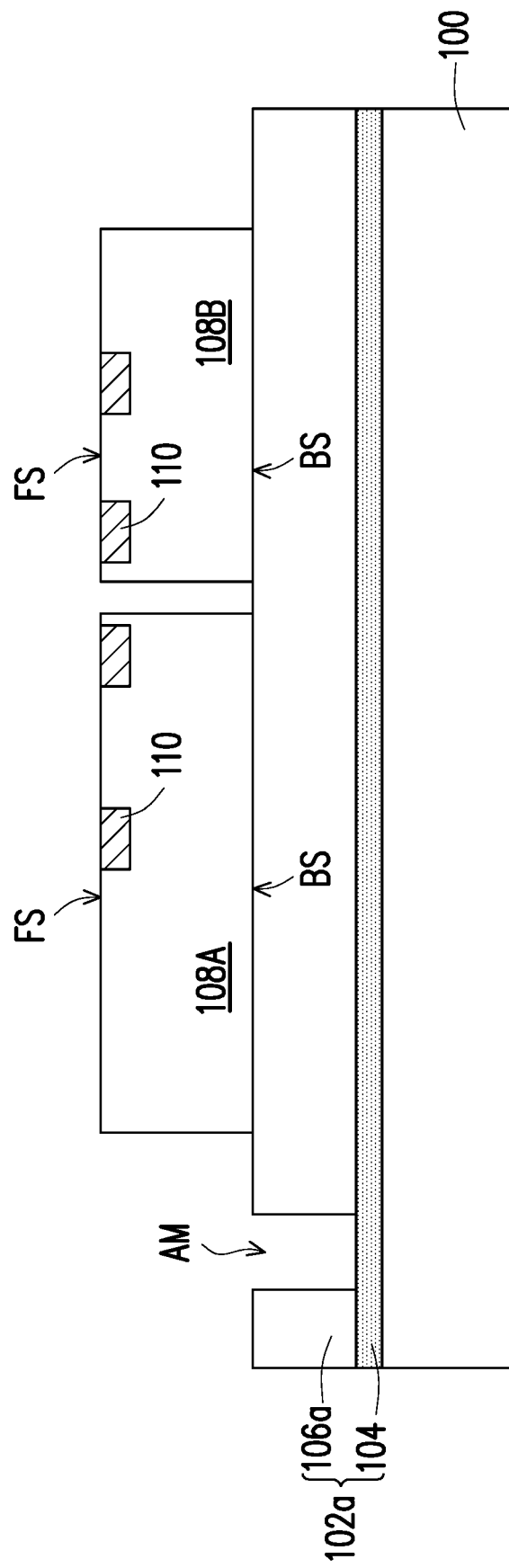

Referring to FIG. 1 and FIG. 2C, step S104 is performed, and at least one high-power device die is placed on the adhesive pattern 102a and aside the opening AM. In some embodiments, a semiconductor die 108A and a semiconductor die 108B are placed on the adhesive pattern 102a. In some embodiments, the semiconductor die 108A includes a high bandwidth memory (HBM) chip. In some embodiments, the semiconductor die 108B includes a high bandwidth memory (HBM) chip. In some embodiments, the semiconductor die 108B includes a system chip, a memory chip or a processor chip. The opening AM in the adhesive pattern 102a functions as an alignment mark when positioning each of the semiconductor dies 108A, 108B. As such, during the placement of the semiconductor dies 108A, 108B, the location shift of the placed semiconductor die(s) is reduced and the positioning accuracy can be improved. In some embodiments, a die-to-die offset (the compensated distance relative to the predetermined desired location) regarding the deviated or shifted semiconductor die can be reduced to 5 μm or less. Each of the semiconductor dies 108A, 108B has a plurality of conductive pads 110, a front side FS and a back side BS opposite to the front side FS. The back side BS faces the adhesive pattern 102a, and the conductive pads 110 located at the front side FS are at least partially exposed from the front side FS of the semiconductor dies 108A, 108B. In some embodiments, the conductive pads 110 may be protruded from the front side FS of the semiconductor dies 108A, 108B.

FIG. 2C' is a schematic top view of the intermediate structure shown in FIG. 2C. FIG. 2C" is a schematic top view illustrating an arrangement of semiconductor dies 108A, 108B and an opening AM of the adhesive pattern 102a according to some embodiments of the present disclosure.

Referring to FIG. 2C', in some embodiments, the opening AM is located beside the semiconductor dies 108A, 108B, closer to the location of the semiconductor die 108A but farther from the location of the semiconductor die 108B. Referring to FIG. 2C", in alternative embodiments, the opening AM may be located beside and between the semiconductor dies 108A, 108B and equally spaced from the semiconductor dies 108A, 108B.

Figure 2D:
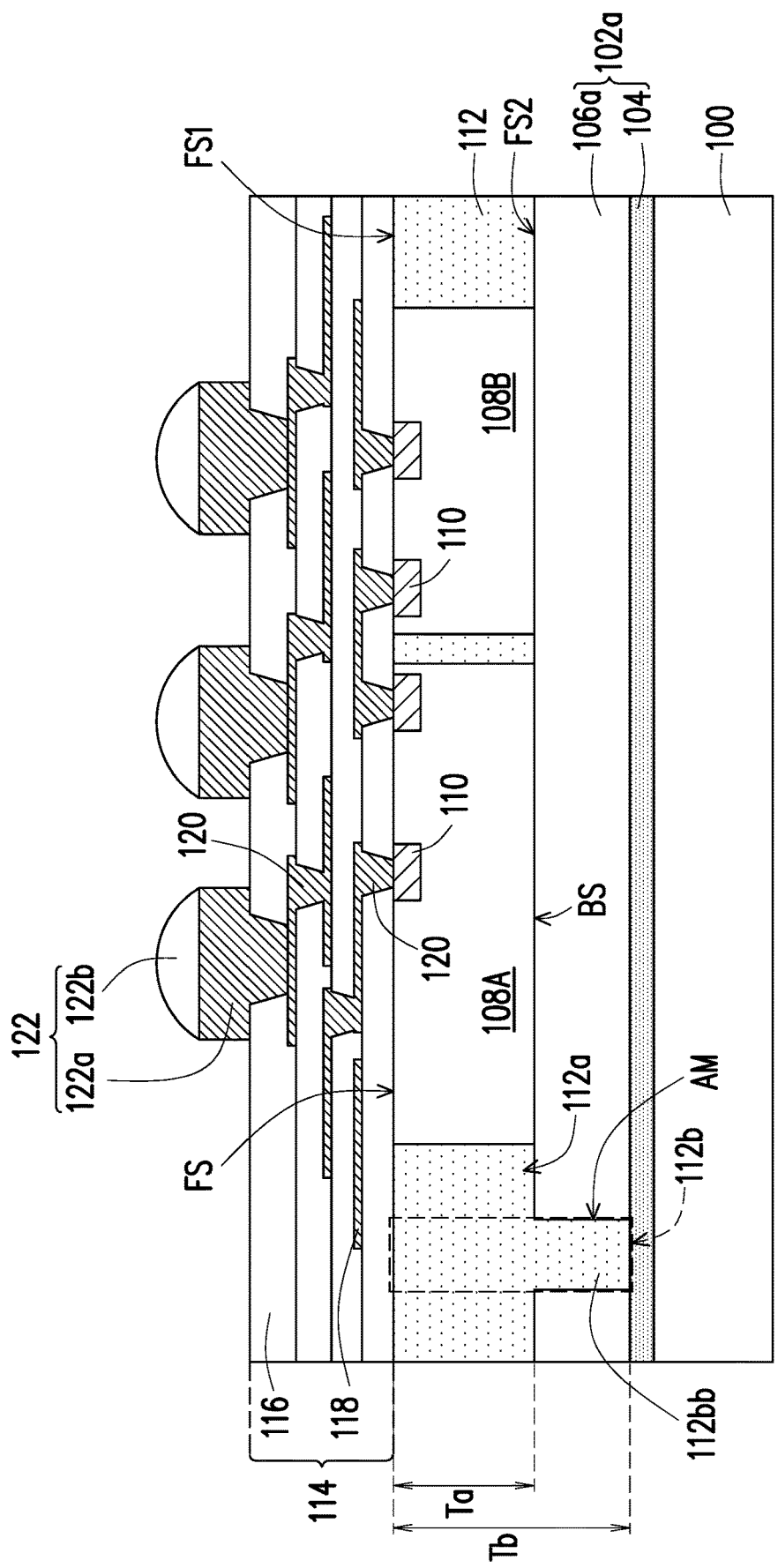

Referring to FIG. 1 and FIG. 2D, step S106 may be performed, and a molding compound 112 is formed on the adhesive pattern 102a, surrounding the semiconductor dies 108A, 108B and filling up the opening AM. In some embodiments, a molding compound material layer (not shown) is formed to cover and over-mold the adhesive structure 102a and the semiconductor dies 108A, 108B, and then thinned to expose the front side FS of the semiconductor dies 108A, 108B, so as to form the molding compound 112. A material of the molding compound 112 includes an epoxy resin, polyimide, silica, a combination thereof or the like. For instance, a planarization process, such as a chemical mechanical polishing (CMP) process or a grinding process, may be performed for thinning the molding compound material layer and hence forming the molding compound 112. In some embodiments, a front surface FS1 of the molding compound 112 is coplanar with the front side FS of the semiconductor dies 108A, 108B. As the molding compound material fills the opening AM formed in the adhesive pattern 102a, the molding compound 112 formed on the adhesive pattern 102a fills up and extends into the opening AM. Accordingly, the molding compound 112 has a body portion 112a located right above the adhesive pattern 102a and an extended portion 112b extended into the opening AM. The body portion 112a spreads from the front surface FS1 of the molding compound 112 to a front surface FS2 of the adhesive pattern 102a, and surrounds each of the semiconductor dies 108A, 108B. In other words, the semiconductor dies 108A, 108B are located in the body portion 112a of the molding compound 112. In some embodiments, the extended portion 112b is located aside semiconductor dies 108A, 108B and spreads from the front surface FS1 of the molding compound 112 into the opening AM of the adhesive pattern 102a. In some embodiments, a lower part 112bb of the extended portion 112b fitted within the opening AM has a shape complementary to the shape of the opening AM. As the lower part 112bb of the extended portion 112b has a shape complementary to the shape of the opening AM, the part 112bb has a shape of a cross shape, a circular shape, a polygonal shape or a combination thereof. In some embodiments, the opening AM exposes the de-bonding layer 104, and the extended portion 112b is in contact with the de-bonding layer 104. The body portion 112a has a first thickness Ta (measuring from the front surface FS1 of the molding compound 112 to the front surface FS2 of the adhesive pattern 102a), and the extended portion 112b has a second thickness Tb (measuring from the front surface FS1 of the molding compound 112 to a top surface of the de-bonding layer 104). The first thickness Ta is substantially equal to a thickness of the semiconductor dies 108A, 108B. The second thickness Tb is greater than the first thickness Ta. For instance, the first thickness Ta ranges from 100 μm to 600 μm. The second thickness Tb may be greater than the first thickness Ta by 3 μm to 20 μm. In some embodiments, a ratio of the first thickness Ta with respect to the second thickness Tb ranges from 0.833 to 0.995.

Step S108 is performed, and as shown in FIG. 2D, a redistribution structure 114 is formed on the front side FS of the semiconductor dies 108A, 108B and on the molding compound 112. The redistribution structure 114 may include a plurality of dielectric layers 116 and a plurality of redistribution layers 118. The dielectric layer 116 and the redistribution layers 118 are alternately stacked on the front side FS of the high-power device dies 108 and the molding compound 112. In some embodiments, a material of the dielectric layer 116 may include silicon oxide, silicon nitride, polybenzoxazole (PBO), polyimide (PI), benzocyclobutene (BCB), a combination thereof or the like. A material of the redistribution layers 118 may include copper, nickel, titanium, a combination thereof or the like. The redistribution structure 114 further includes a plurality of conductive vias 120. In some embodiments, a material of the conductive vias 120 is identical to the material of the redistribution layers 118. Each of the conductive vias 120 penetrates through one of the dielectric layers 116. Some of the conductive vias 120 are physically connected to the conductive pads 110 of the semiconductor dies 108A, 108B and electrically connect the semiconductor dies 108A, 108B with the redistribution layers 118. Rest of the conductive vias 120 are located between vertically adjacent redistribution layers 118 for electrically connecting the redistribution layers 118. In some embodiments, the opening AM in the adhesive pattern 102a also functions as an alignment mark during the formation of the redistribution structure 114. For example, the opening AM can be used as an alignment mark when performing a lithography process for forming the conductive vias 120. With the alignment mark(s), less misalignment for placing the semiconductor dies 108A, 108B and better alignment for forming the conductive via 120 over the conductive pads 110 of the semiconductor dies 108A, 108B are achieved. Thereby, a via-to-pad overlay shift (the deviation distance relative to the predetermined desired location) regarding the conductive pads 110 and the corresponding conductive vias 120 can be reduced to 3 µm or less.

In addition, a plurality of electrical connectors 122 are formed on the redistribution structure 114. The electrical connectors 122 are disposed on the topmost dielectric layer 116 and are connected to the topmost redistribution layer 118, functioning as the electrical terminals for further electrical connection. In some embodiments, each of the electrical connectors 122 may include a conductive pillar 122a and a cap layer 122b located on the conductive pillar 112a. The conductive pillar 122a is disposed within the opening of the topmost dielectric layer 116 and connected to the topmost redistribution layer 118. In some embodiments, a material of the conductive pillar 122a may include copper, aluminum, gold, nickel, palladium, the like, or a combination thereof and may be formed by sputtering, printing, electro plating, electroless plating, CVD or the like. A material of the cap layer 122b may include nickel, tin, tin-lead, gold, copper, silver, palladium, indium, nickel-palladium-gold, nickel-gold, the like, or a combination thereof, and may be formed by a plating process. In alternative embodiments, the electrical connectors 122 are solder balls and/or bumps, such as controlled collapse chip connection (C4), electroless nickel immersion Gold (ENIG), electroless nickel electroless palladium immersion gold technique (ENEPIG) formed bumps or the like. In these embodiments, the bumps may include a conductive material such as solder, copper, or gold. The electrical connectors may be formed by suitable methods such as evaporation, electroplating, printing, solder transfer, ball placement or the like. In addition, a reflow may be performed in order to shape the material into the desired bump shapes.

Figure 2E:
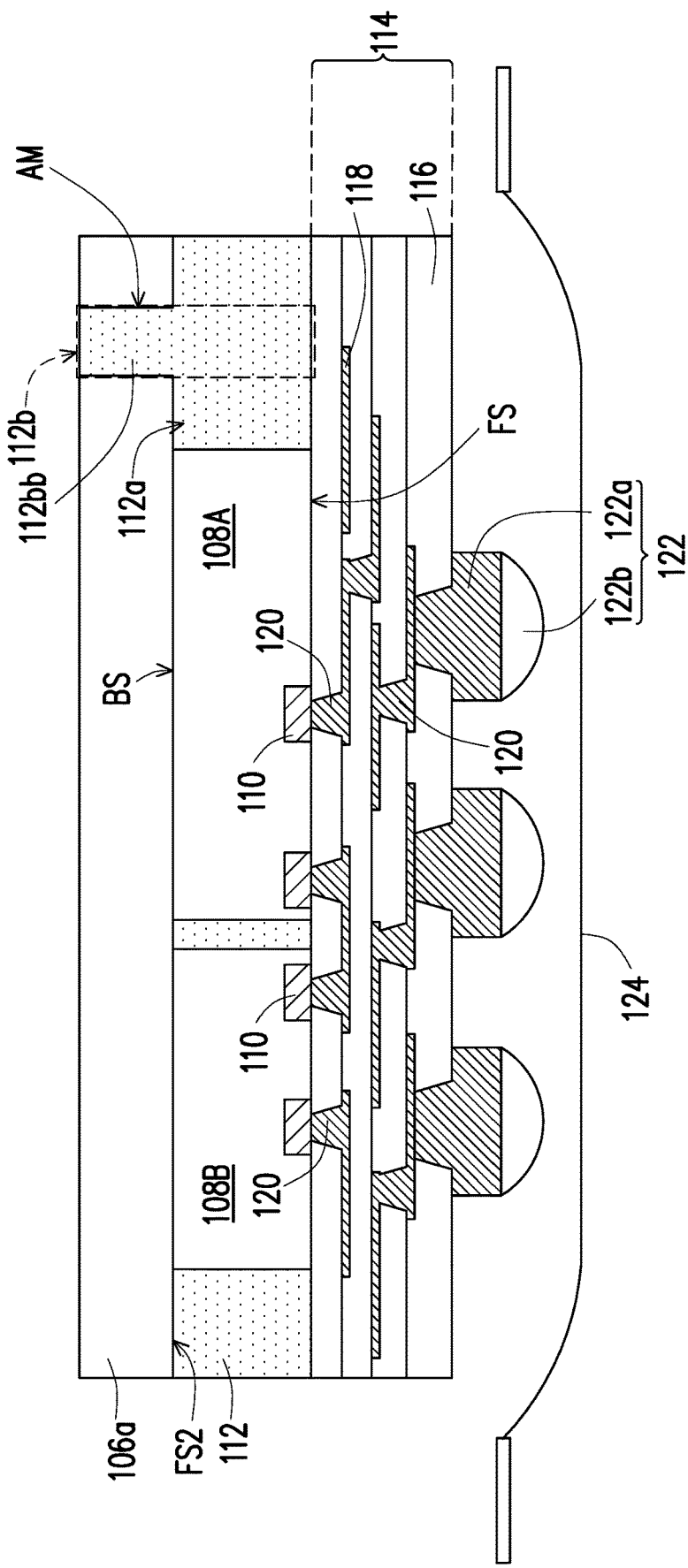

Referring to FIG. 1 and FIG. 2E, step S110 is performed, and the carrier substrate 100 and the de-bonding layer 104 are removed. In some embodiments, the de-bonding layer 104 is a LTHC layer or a thermal release layer, and the carrier substrate 100 is detached from the die attach film 106a as the de-bonding layer 104 loses its adhesive property when exposed to light or heat. That is, the carrier substrate 100 and the de-bonding layer 104 are detached and separated from the die attach film 106a, and then removed. In some embodiments, the entire structure may be flipped over and attached to a tape 124 before or after the carrier substrate 100 and the de-bonding layer 104 are removed.

Figure 2F:
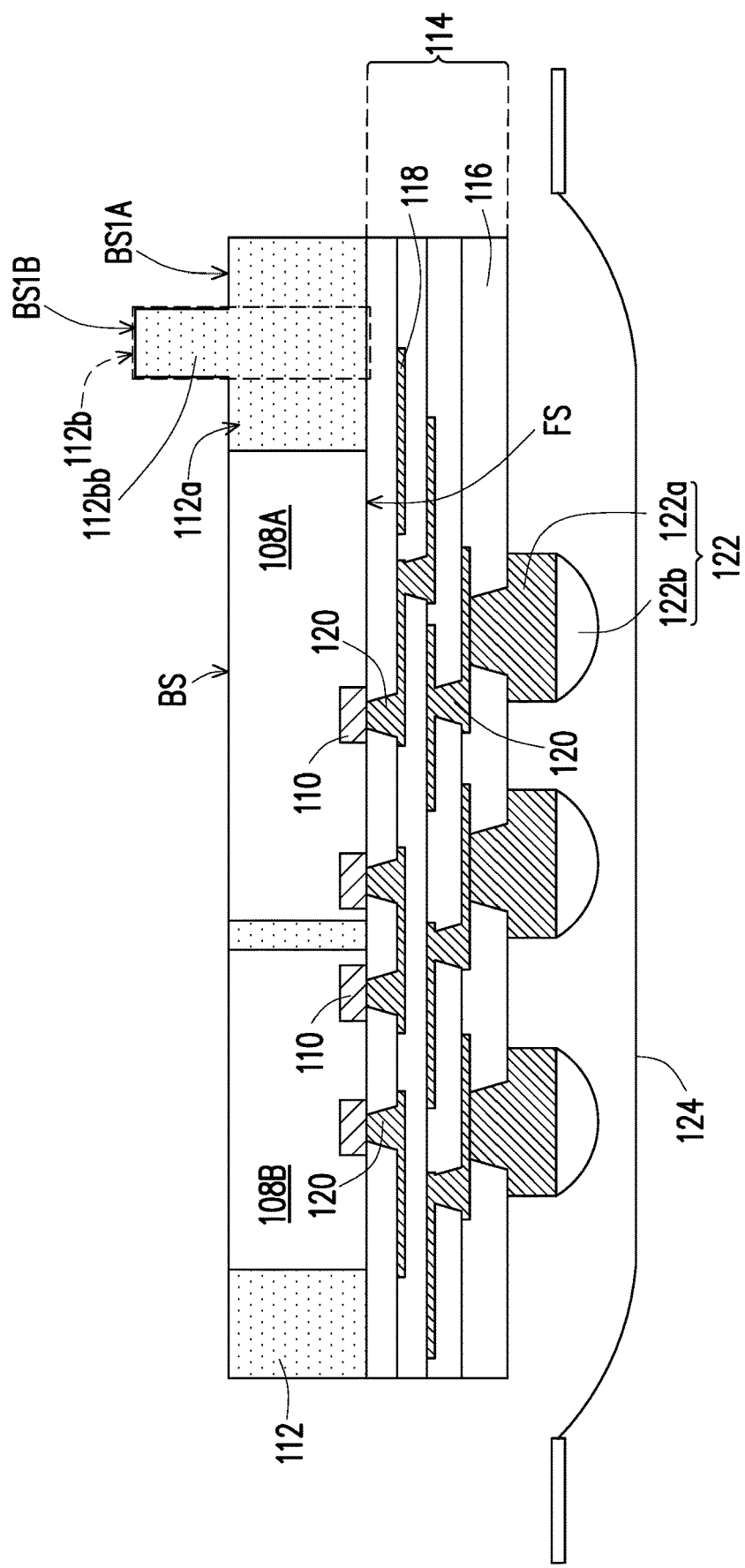

Referring to FIG. 1 and FIG. 2F, step S112 is performed, and the die attach film 106a of the adhesive pattern 102a is removed. In some embodiments, the die attached film 106 is removed by performing a stripping process, an etching process and/or a cleaning process. After removing the die attach film 106a, the adhesive pattern 102a is removed and the back side BS of the semiconductor dies 108A, 108B and the molding compound 112 are exposed. In some embodiments, the back sides BS of the semiconductor dies 108A, 108B are coplanar and levelled with a back surface BS1A of the body portion 112a of the molding compound 112. In some embodiments, the part 112bb of the extended portion 112b is protruded from the back surface BS1A of the body portion 112a of the molding compound 112. In some embodiments, a singulation process, such as a sawing process or a cutting process, is performed on the current structure. The singulated structure may contain one or more of the semiconductor dies, and may be referred as a single-die package structure or a multi-die package structure.

Figure 2G:
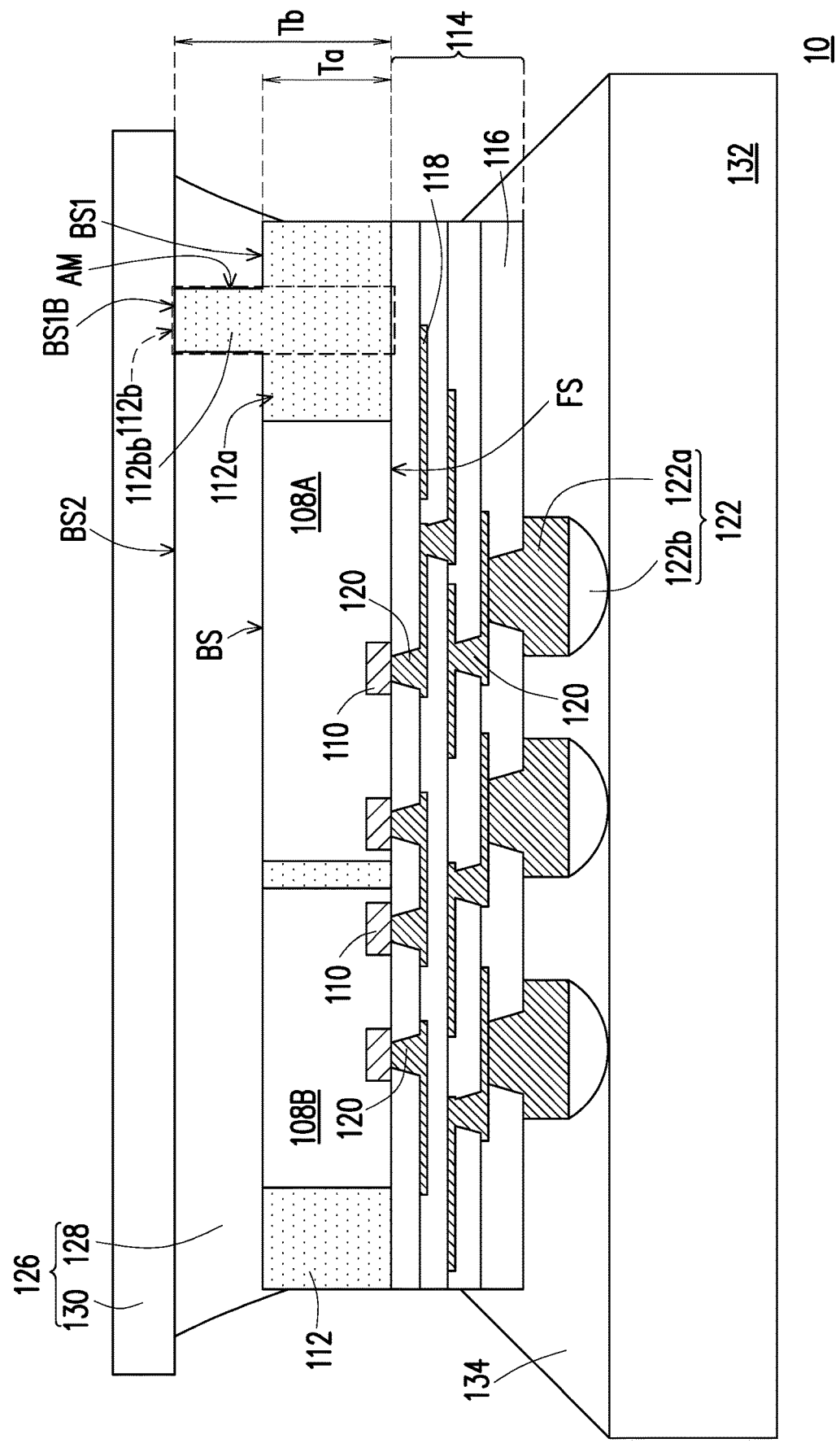

Referring to FIG. 1 and FIG. 2G, step S114 is performed, and a heat dissipation module 126 is formed on the molding compound 112 and over the back sides BS of the semiconductor dies 108A, 108B. In some embodiments, the formation of the heat dissipation module 126 may include sequentially forming a thermal interfacial layer 128 and providing a lid 130 on the thermal interfacial layer 128. The thermal interfacial layer 128 is formed over the semiconductor dies 108A, 108B and the molding compound 112. In some embodiments, the thermal interfacial layer 128 is in direct contact with the back side BS of the semiconductor dies 108A, 108B and in direct contact with the molding compound 112. The lid 130 is provided on the thermal interfacial layer 128, such that the thermal interfacial layer 128 is located between the semiconductor dies 108A, 108B and the lid 130. In some embodiments, the lid 130 is in direct contact with the back surface BS1B of the protruded part 112bb, and the thermal interfacial layer 128 fills between the lid 130, the semiconductor dies 108A, 108B and the body portion 112a and surrounds the protruded part 112bb of the extended portion 112b. In another aspect, the extended portion 112b of the molding compound 112 penetrates through the thermal interfacial layer 128, and is in contact with the lid 130. In addition, in certain embodiments, the thermal interfacial layer 128 may further extend to cover a sidewall of the molding compound 112. In some embodiments, an interface between the body portion 112b and the thermal interfacial layer 128 of the heat dissipation module 126 is substantially parallel to or coplanar with the back side BS of the semiconductor dies 108A, 108B. In some embodiments, a material of the thermal interfacial layer 128 may include a composite material containing polymer with inorganic material or metal oxide. A material of the lid 130 may include steel, copper, a combination thereof or the like.

In some embodiments, after the formation of the heat dissipation module 126 and detaching the tape 124, the redistribution structure 114 and the electrical connectors 122 are further mounted to a package substrate 132, thus completing the semiconductor package 10. In some embodiments, the electrical connectors 122 are bonded to the package substrate 132 through a solder flux by performing a reflow process. As such, the redistribution structure 114 and the electrical connectors 122 are located in between the semiconductor dies 108A, 108B and the package substrate 132. In some embodiments, the package substrate 132 may include a printed circuit board (PCB) or an organic package substrate. For example, the organic package substrate may include a flexible organic package substrate, a core organic package substrate or a core-less organic package substrate. In some embodiments, an underfill 134 is formed to fill a space between the redistribution structure 114, the electrical connectors 122 and the package substrate 132. In some embodiments, the underfill 134 surrounds each of the electrical connectors 122. In addition, the underfill 134 may further extend to a sidewall of the redistribution structure 114. For instance, a material of the underfill 134 may include epoxy resin, silica rubber, a combination thereof or the like.

So far, the semiconductor package 10 according to some embodiments has been fabricated. With reference to FIG. 2G, a structure of the semiconductor package 10 will be discussed.

According to some embodiments, the semiconductor package 10 includes the high-power device die(s) 108, the redistribution structure 114, the heat dissipation module 126 and the molding compound 112. The high-power device die(s) (e.g., the semiconductor dies 108A, 108B) has the front side FS and the back side BS opposite to the front side FS. The redistribution structure 114 is disposed at the front side FS of the high-power device die(s) (e.g., the semiconductor dies 108A, 108B). The heat dissipation module 126 is disposed between the redistribution structure 114 and the back side BS of the high-power device die(s) (e.g., the semiconductor dies 108A, 108B). The molding compound 112 is disposed between the redistribution structure 114 and the heat dissipation module 126, and surrounds the high-power device die(s) (e.g., the semiconductor dies 108A, 108B). The molding compound 112 has the body portion 112a and the extended portion 112b. The interface between the body portion 112a and the heat dissipation module 126 is substantially parallel to the back side BS of the high-power device die(s) (e.g., the semiconductor dies 108A, 108B). The second thickness Tb of the extended portion 112b is greater than the first thickness Ta of the body portion 112a.

In some embodiments, the high-power device die(s) (e.g., the semiconductor dies 108A, 108B) is located in the body portion 112a of the molding compound 112. In some embodiments, the shape of a top view of the extended portion 112b of the molding compound 112 includes a cross shape, a circular shape, a polygonal shape or a combination thereof. In some embodiments, the heat dissipation module 126 includes the thermal interfacial layer 128 and the lid 130. The thermal interfacial layer 128 is indirect contact with the back side BS of the high-power device die(s) (e.g., the semiconductor dies 108A, 108B). The thermal interfacial layer 128 is disposed between the high-power device die(s) (e.g., the semiconductor dies 108A, 108B) and the lid 130. In some embodiments, the extended portion 112b penetrates through the thermal interfacial layer 128, and is in contact with the lid 130. In some embodiments, the semiconductor package 10 further includes the package substrate 132 and the underfill 134. The package substrate 132 is bonded to the redistribution structure 114, such that the redistribution structure 114 is located in between the high-power device die(s) (e.g., the semiconductor dies 108A, 108B) and the package substrate 132. The underfill 134 fills a space between the redistribution structure 114 and the package substrate 132.

Figure 3:
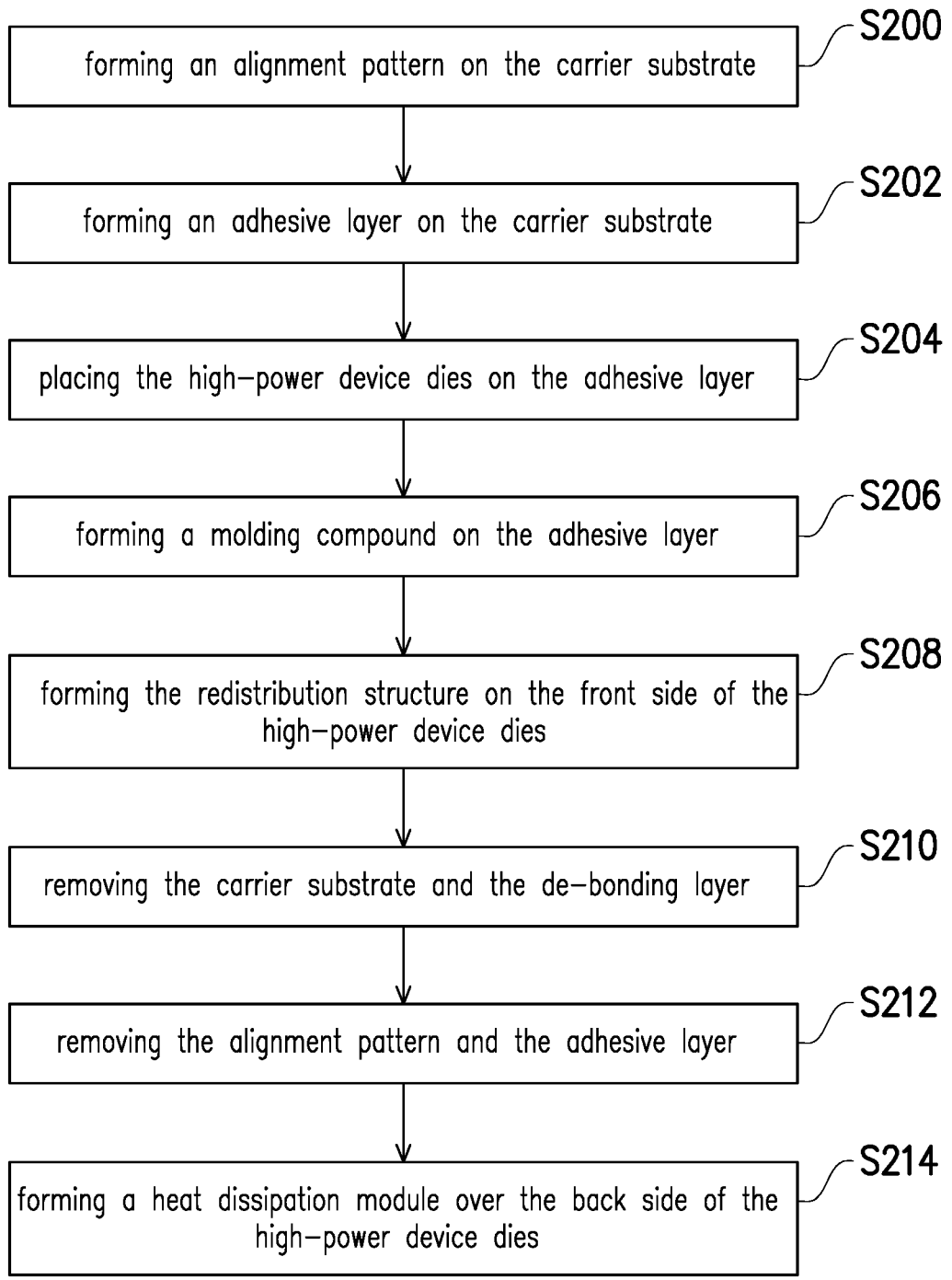
FIG. 3 is an exemplary flow chart showing the process steps of a manufacturing method of semiconductor package according to some embodiments of the present disclosure.

FIG. 3 is an exemplary flow chart showing the process steps of a manufacturing method of a semiconductor package 20 according to some embodiments of the present disclosure. FIG. 4A through FIG. 4G are schematic cross-sectional views illustrating intermediate structures and package structures at various stages according to the manufacturing method of the semiconductor package 20 shown in FIG. 3. The manufacturing method of the semiconductor package 20 is similar with the manufacturing method of the semiconductor package 10, only the difference therebetween will be discussed, the same or similar parts will not be repeated again. In addition, identical or similar components are denoted with the same or similar reference numerals.

Figure 4A:
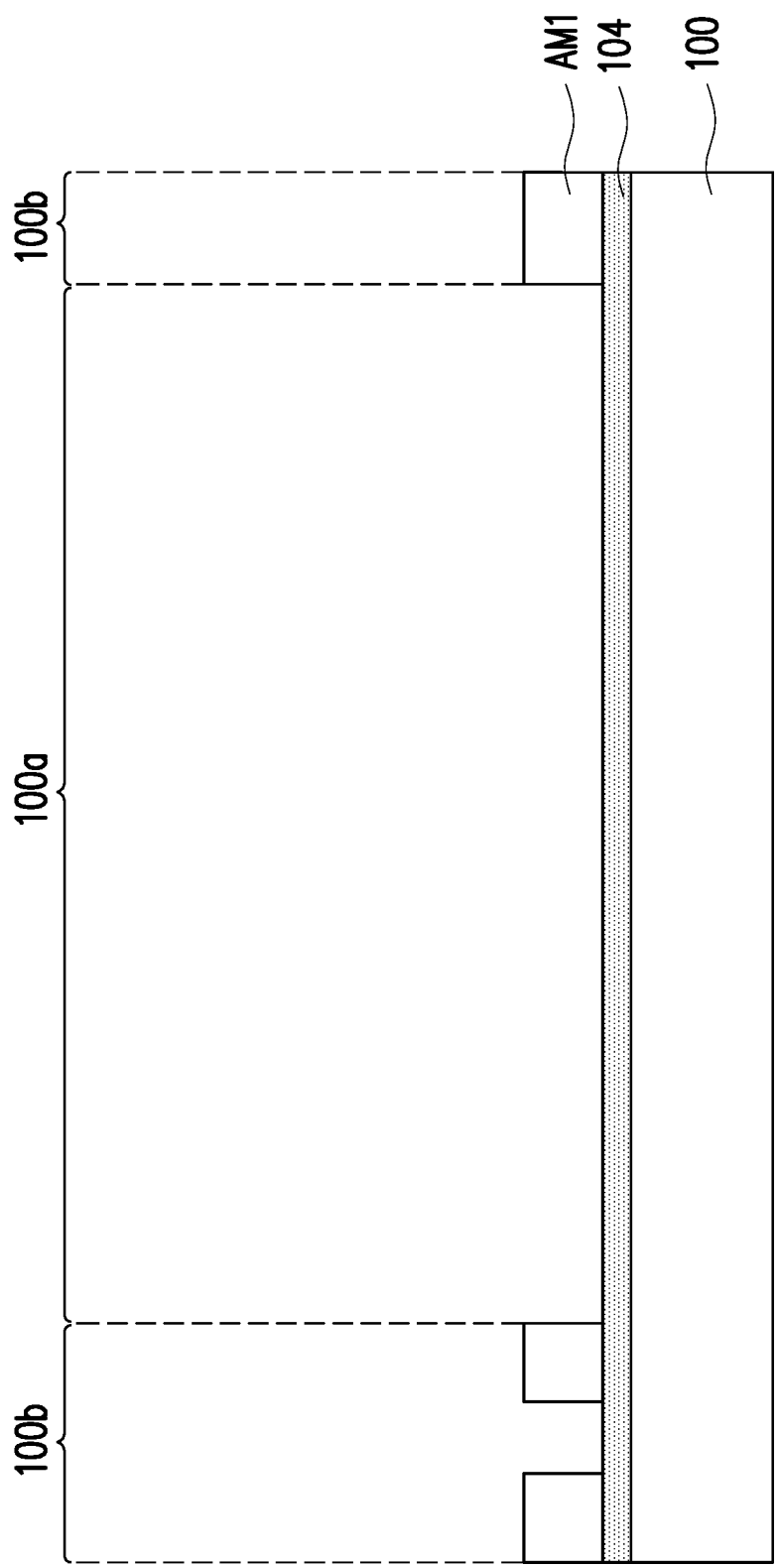
FIG. 4A through FIG. 4G are schematic cross-sectional views illustrating intermediate structures and package structures at various stages according to the manufacturing method of semiconductor package shown in FIG. 3.

Referring to FIG. 3 and FIG. 4A, step S200 is performed, and an alignment pattern AM1 is formed on the provided carrier substrate 100. In some embodiments, a formation method of the alignment pattern AM1 may include forming a dielectric layer or a reflective layer on the carrier substrate 100. For instance, a material of the dielectric layer may include silicon oxide, silicon nitride, a combination thereof or the like. A material of the reflective layer may include aluminum, silver, a composite material of copper, a combination thereof or the like. Afterwards, the dielectric layer or the reflective layer is patterned, to form the alignment pattern AM1. In some embodiments, the de-bonding layer 104 is formed on the carrier substrate 100 before the alignment pattern AM1 is formed. The carrier substrate 100 has a device region 100a and a peripheral region 100b. In some embodiments, the peripheral region 100b surrounds the device region 100a. The alignment pattern AM1 is formed in the peripheral region 100b. In some embodiments, at least a portion of the peripheral region 100b may not be overlapped with a scribe line region, such that the alignment pattern AM1 would at least partly remain in the semiconductor package after the singulation process is performed. In alternative embodiments, the peripheral region 100b is located in the scribe line region of the semiconductor package 20, such that the alignment pattern AM1 would be removed after a singulation process is performed. In some embodiments, a material of the alignment pattern AM1 may include a dielectric material, such as silicon oxide, silicon nitride, a combination thereof or the like. Similar to the opening AM shown in FIG. 2B, from a top view, the shape of a hollow portion of the alignment pattern AM1 may be a cross shape. In alternative embodiments, from the top view, the shape of the hollow portion of the alignment pattern AM1 may include a cross shape, a circular shape, a polygonal shape or a combination thereof. As such, the alignment pattern AM1 can function as an alignment mark during subsequently performed steps.

Figure 4B:
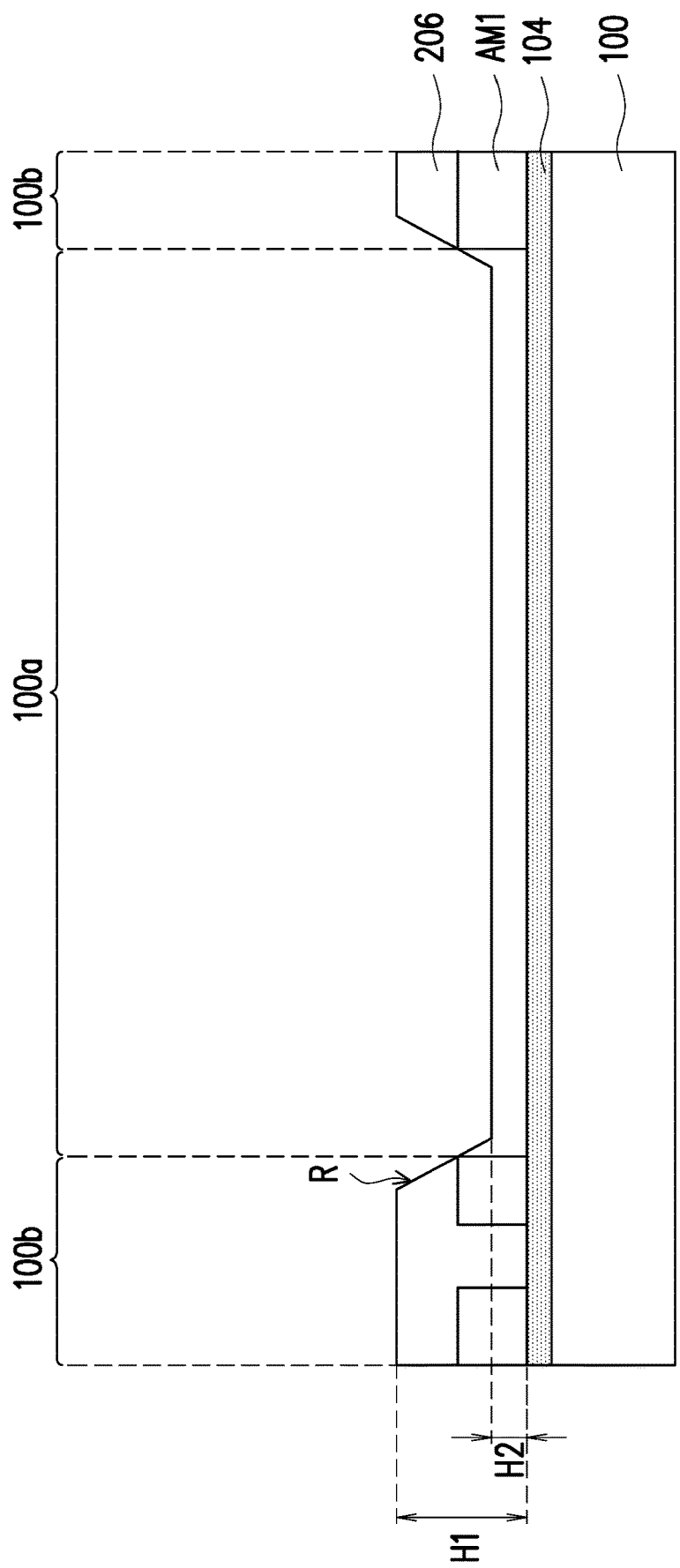

Referring to FIG. 3 and FIG. 4B, step S202 is performed, and an adhesive layer 206 is formed on the carrier substrate 100. The adhesive layer 206 is formed in the device region 100a and the peripheral region 100b, and covers the alignment pattern AM1. Due to a step height of the alignment pattern AM1, a height H1 of the adhesive layer 206 in the peripheral region 100b may be greater than a height H2 of the adhesive layer 206 in the device region 100a. In another aspect, the adhesive layer 206 has a recess R in the device region 100a, and the recess R is located aside the alignment pattern AM1. In alternative embodiments, an adhesive material layer having a uniform thickness throughout the carrier substrate 100 may be initially formed, and then a portion of the adhesive material layer may be removed, in order to form the adhesive layer 206 with the recess R. In some embodiments, the adhesive layer 206 may be a die attach film.

Figure 4C:
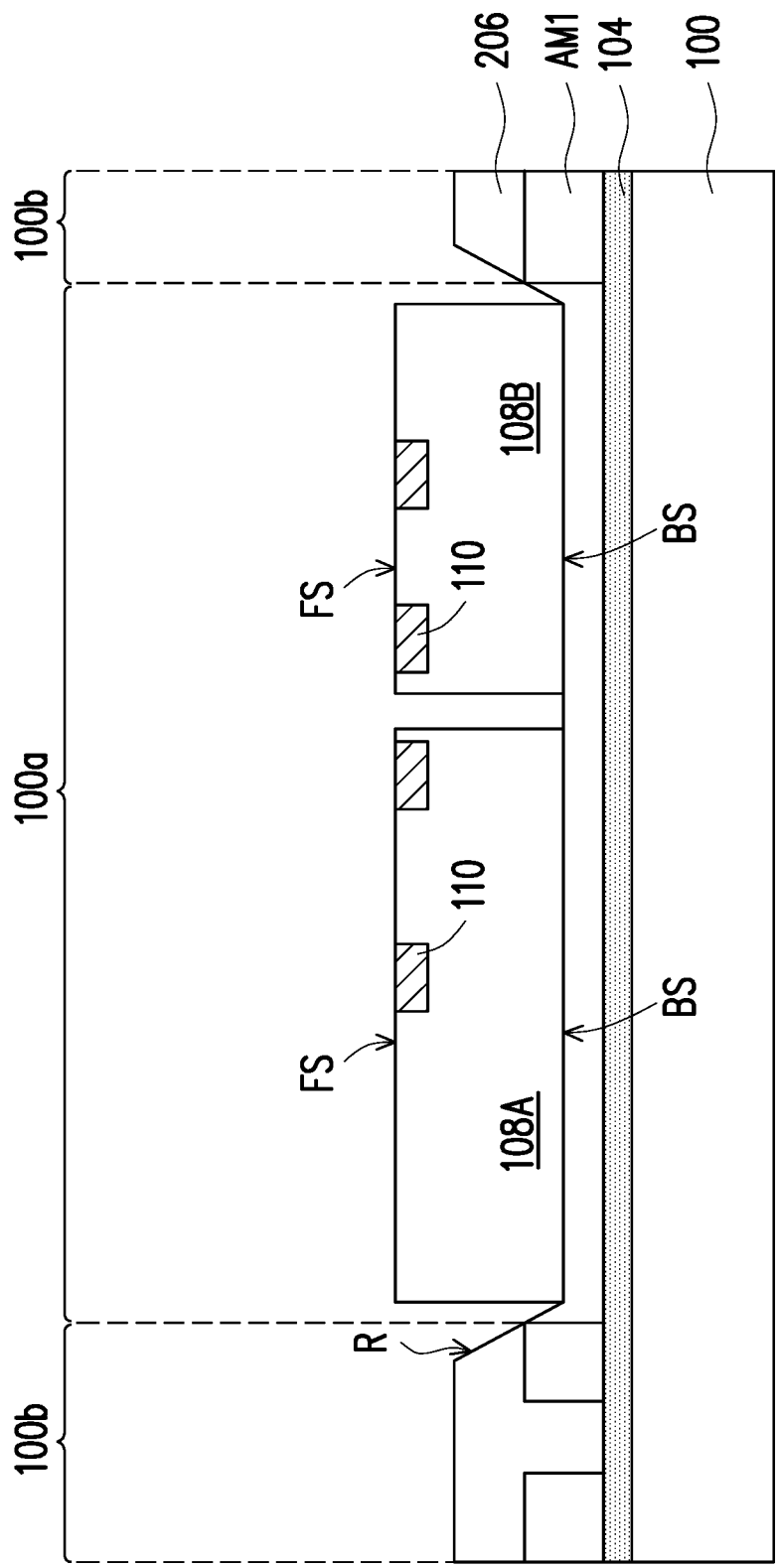

Referring to FIG. 3 and FIG. 4C, step S204 is performed, and the at least one high-power device die is placed on the adhesive layer 206. In some embodiments, the semiconductor dies 108A, 108B are placed on the adhesive layer 206. In some embodiments, the semiconductor dies 108 are placed in the recess R of the adhesive layer 206. The alignment pattern AM1 can be used as an alignment mark when positioning each of the semiconductor dies 108A, 108B. As such, during the placement of the semiconductor dies 108A, 108B, the location shift of the placed semiconductor die(s) is reduced and the positioning accuracy can be improved. In some embodiments, a die-to-die offset (the compensated distance relative to the predetermined desired location) regarding the deviated or shifted semiconductor die can be reduced to 3 μm or less. Similar to the opening AM shown in FIG. 4C' and FIG. 4C", the alignment pattern AM1 may be located beside the semiconductor dies 108A, 108B, or the alignment pattern AM1 may be located beside and between the semiconductor dies 108A, 108B and equally spaced from the semiconductor dies 108A, 108B.

Figure 4D:
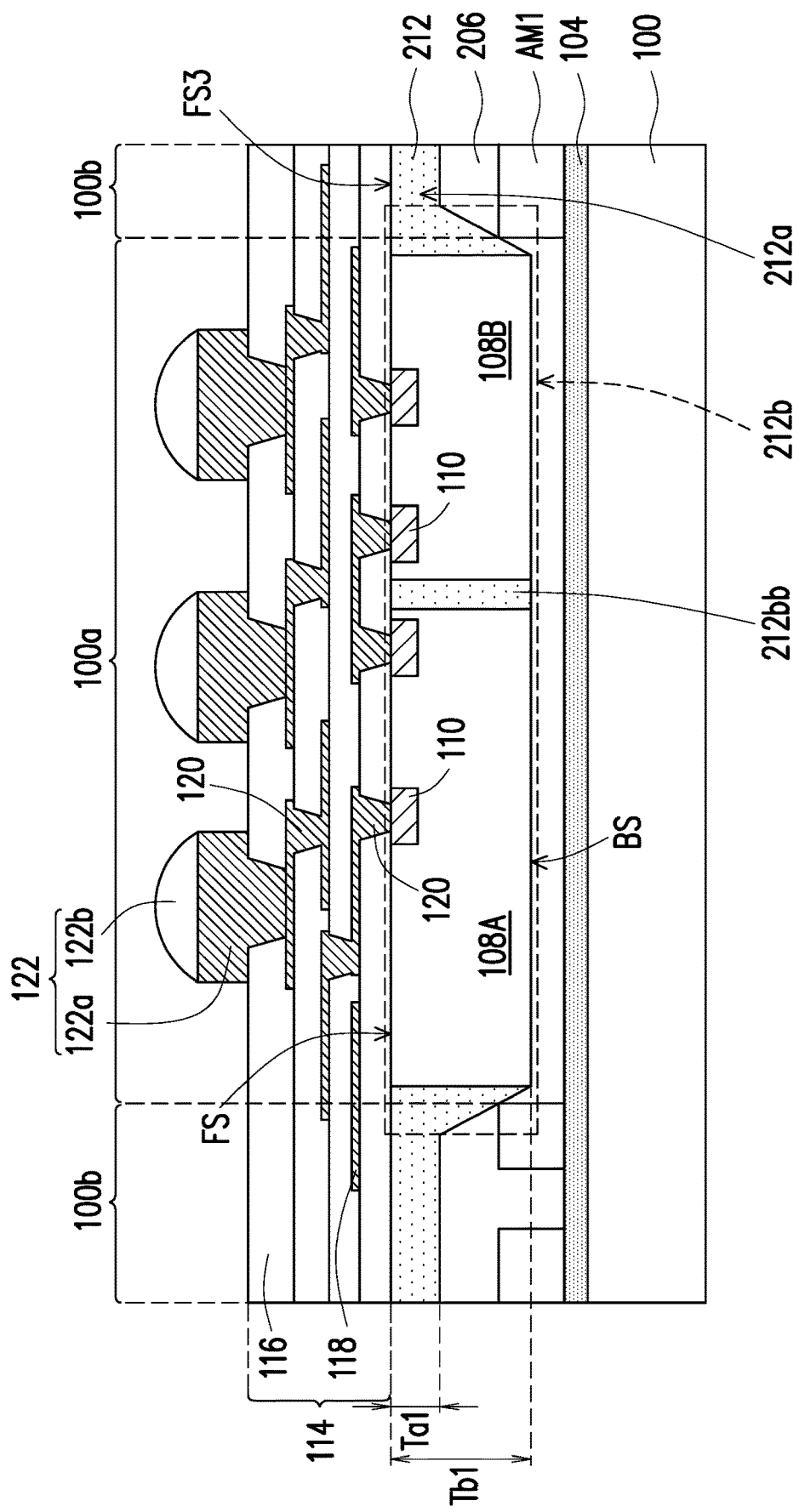

Referring to FIG. 3 and FIG. 4D, step S206 is performed, and a molding compound 212 is formed on the adhesive layer 206. The molding compound 212 is formed in the device region 100a and the peripheral region 100b. The molding compound 212 surrounds each of the high-power device dies 108, and fills up the recess R. In addition, the molding compound 212 exposes the front side FS of the semiconductor dies 108A, 108B. In some embodiments, a front surface FS3 of the molding compound 212 is coplanar with the front side FS of the semiconductor dies 108A, 108B. In some embodiments, as the molding compound 212 fills the recess R formed in the adhesive layer 206, the molding compound 112 formed on the adhesive layer 206 fills up and extends into the recess R. Accordingly, the molding compound 212 has a body portion 212a located right above the alignment pattern AM1 and an extended portion 212b extended into the recess R. The body portion 212a is located beside the recess R, and spreads between the front surface FS3 of the molding compound 212 and the adhesive layer 206. The extended portion 202b filled in the recess R surrounds each of the semiconductor dies 108A, 108B, and spreads between the front surface FS3 of the molding compound 212 and the adhesive layer 206. In other words, the high-power device dies 108 are located in the extended portion 212b. In some embodiments, a lower part 212bb of the extended portion 212b fitted within the recess R has a shape complementary to the shape of the recess R. The body portion 212a has a first thickness Ta1, and the extended portion 212b has a second thickness Tb1. The second thickness Tb1 is substantially equal to a thickness of the high-power device die 108. The second thickness Tb1 is greater than the first thickness Ta1. For instance, the second thickness Tb1 ranges from 100 μm to 600 μm. The first thickness Ta1 is less than the second thickness Tb1 by 5 μm to 20 μm. In some embodiments, a ratio of the first thickness Ta1 with respect to the second thickness Tb1 ranges from 0.8 to 0.992.

Step 208 is performed, and the redistribution structure 114 is formed on the front side FS of the semiconductor dies 108A, 108B and on the molding compound 212. The redistribution structure 114 covers the high-power device dies 108 and the molding compound 212. In some embodiments, the alignment pattern AM1 also functions as an alignment mark when performing a lithography process for forming the conductive vias 120 of the redistribution structure 114. Thereby, a via-to-pad overlay shift (the deviation distance relative to the predetermined desired location) regarding the conductive pads 110 and the corresponding conductive vias 120 can be reduced to 3 μm or less. Furthermore, the electrical connectors 122 are formed on the topmost dielectric layer 116 of the redistribution structure 114, and are connected to the topmost redistribution layer 118.

Figure 4E:
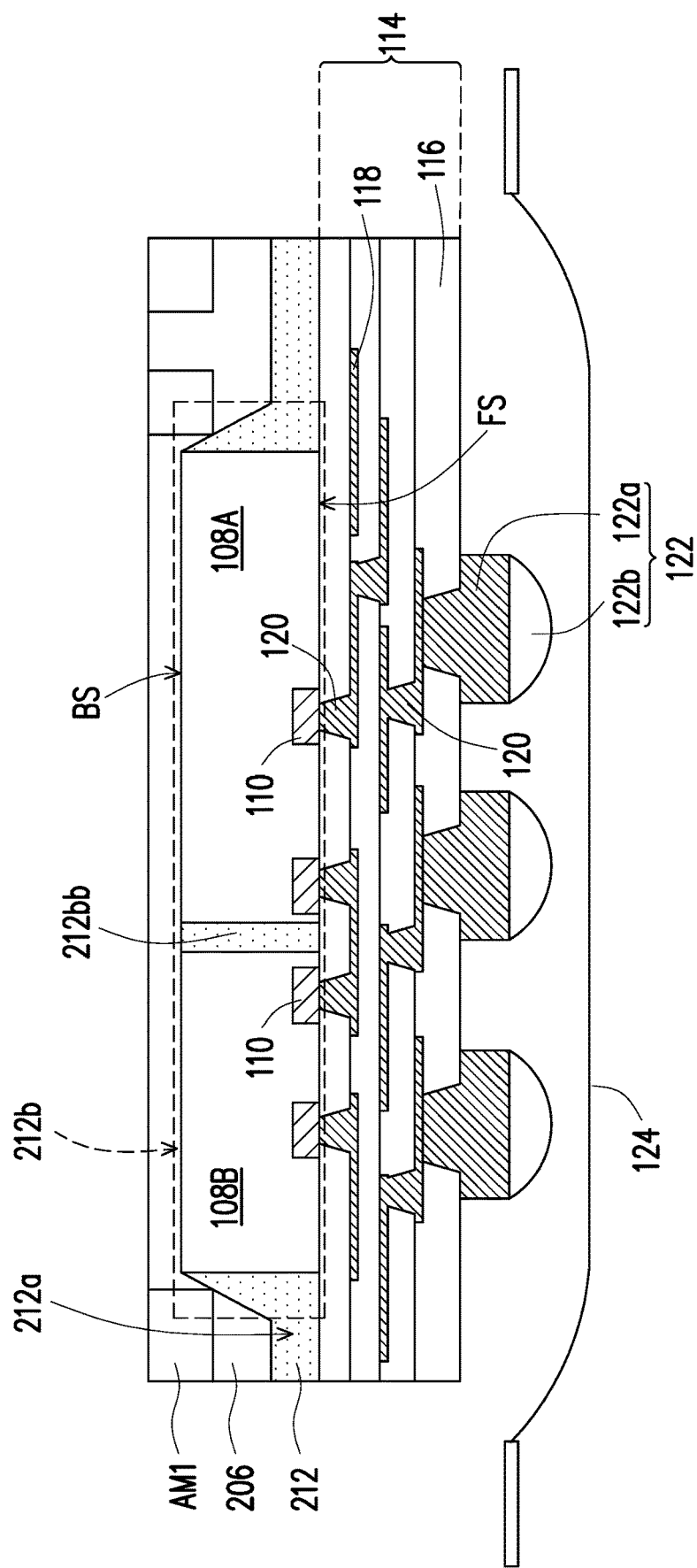

Referring to FIG. 3 and FIG. 4E, step S210 is performed, and the carrier substrate 100 and the de-bonding layer 104 are removed. As such, the adhesive layer 206 and the alignment pattern AM1 are exposed. In some embodiments, the entire structure may be flipped over and attached to a tape 124 before or after the carrier substrate 100 and the de-bonding layer 104 are removed.

Figure 4F:
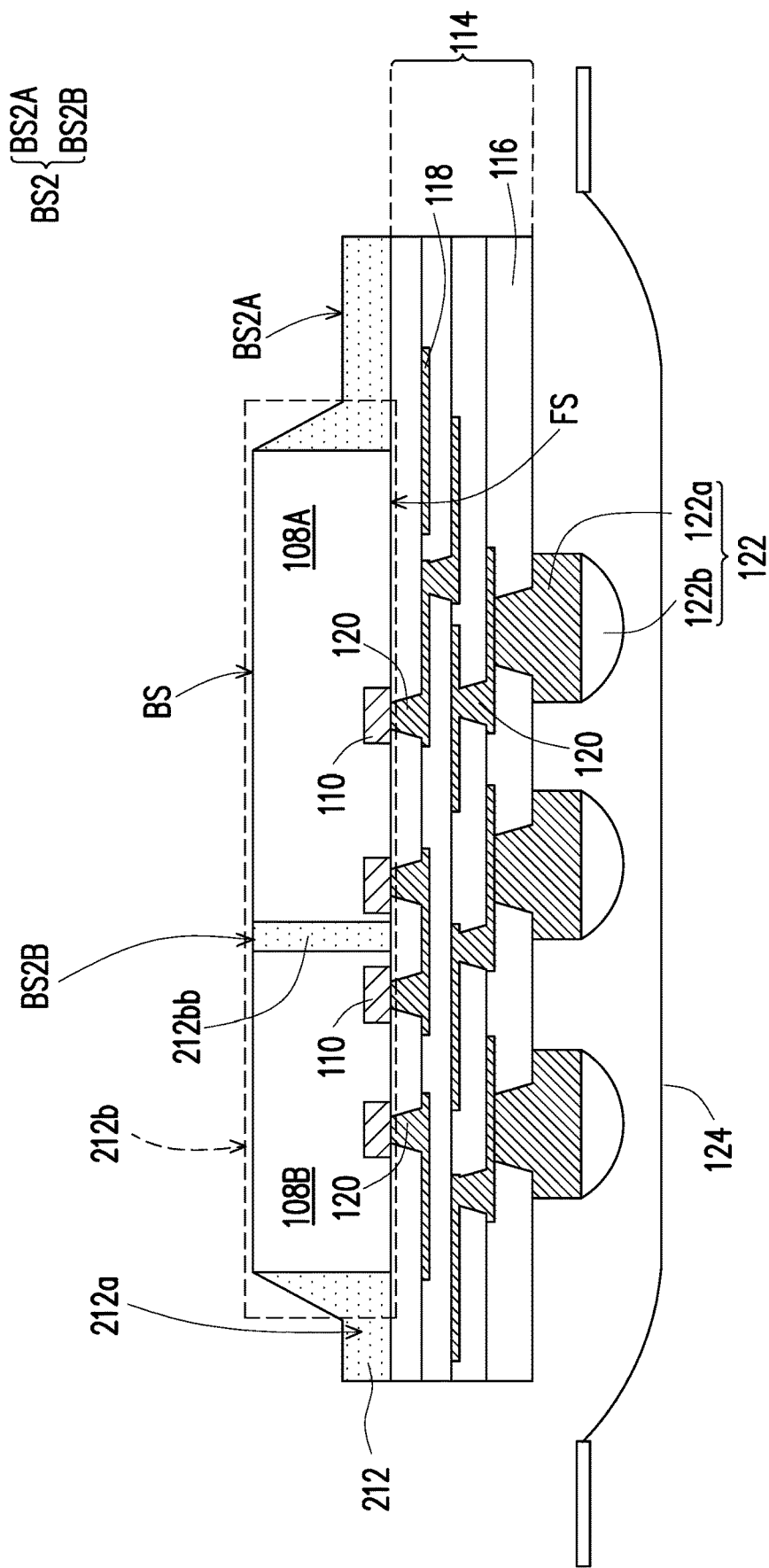

Referring to FIG. 3 and FIG. 4F, step S212 is performed, and the alignment pattern AM1 and the adhesive layer 206 are removed. In some embodiments, the alignment pattern AM1 and the adhesive layer 206 are completely removed. As such, the back side BS of the semiconductor dies 108A, 108B and a back surface BS2 of the molding compound 212 opposite to the redistribution structure 114 are exposed. In some embodiments, the back side BS of the semiconductor dies 108A, 108B is coplanar and levelled with a back surface BS2B of the part 212bb of the extended portion 212b. In some embodiments, the back surface BS2B of the part 212bb is protruded from a back surface BS2A of the body portion 212a. In some embodiments, a singulation process, such as a sawing process or a cutting process, is performed on the current structure. The singulated structure may contain one or more of the semiconductor dies, and may be referred as a single-die package structure or a multi-die package structure.

Figure 4G:
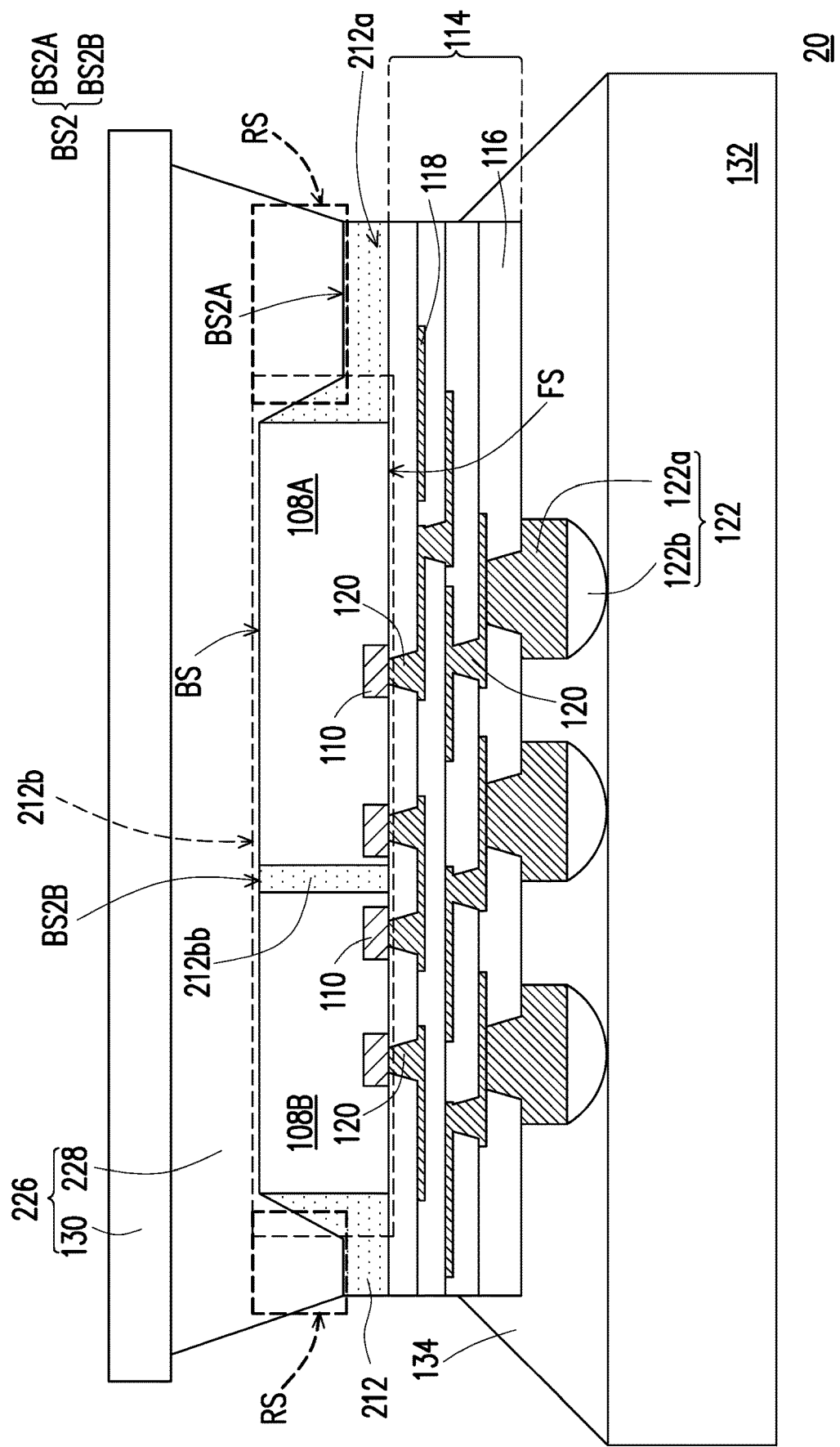

Referring to FIG. 3 and FIG. 4G, step S214 is performed, and a heat dissipation module 226 is formed on the molding compound 212 and over the back sides BS of the semiconductor dies 108A, 108B. In some embodiments, the formation of the heat dissipation module 226 may include sequentially forming a thermal interfacial layer 228 and providing the lid 130. The thermal interfacial layer 228 is formed over the semiconductor dies 108A, 108B and the molding compound 212. In some embodiments, the thermal interfacial layer 228 is in direct contact with the back side BS of the semiconductor dies 108A, 108B and in direct contact with the molding compound 212. The lid 130 is provided on the thermal interfacial layer 228, such that the thermal interfacial layer 228 is located in between the semiconductor dies 108A, 108B and the lid 130. In some embodiments, the thermal interfacial layer 228 is in direct contact with the back surface BS2A of the body portion 212a and the back surface BS2B of the protruded part 212bb of the extended portion 212b. The thermal interfacial layer 228 fills between the lid 130, the semiconductor dies 108A, 108B and the body portion 212a, and surrounds the protruded part 212bb of the extended portion 212b. In some embodiments, the heat dissipation module 226 has a rib structure RS. In some embodiments, the rib structure RS may be a portion of the thermal interfacial layer 228. In other words, the rib structure RS and the thermal interfacial layer 228 are constituted of the same material. As such, an interface between the thermal interfacial layer 228 and the rib structure RS may be absent. The rib structure RS protrudes from the thermal interfacial layer 228 toward the body portion 212a of the molding compound 212. In some embodiments, the rib structure RS is indirect contact with the body portion 212a of the molding compound 212. In addition, the rib structure RS surrounds the protruding part 212bb of the extended portion 212b of the molding compound 212.

In some embodiments, after the formation of the heat dissipation module 226 and detaching the tape 124, the redistribution structure 114 and the electrical connectors 122 are further mounted to the package substrate 132, thus completing the semiconductor package 20. As such, the redistribution structure 114 and the electrical connectors 122 are located in between the semiconductor dies 108A, 108B and the package substrate 132. In some embodiments, an underfill 134 is formed to fill a space between the redistribution structure 114 and the package substrate 132. In some embodiments, the underfill 134 surrounds each of the electrical connectors 122. In addition, the underfill 134 may further extend to a sidewall of the redistribution structure 114.

So far, the semiconductor package 20 according to some embodiments has been fabricated. The alignment pattern AM1 has been removed in step S212, such that the alignment pattern AM1 is absent in the final structure of the semiconductor package 20. Even though, a location shift of the placed semiconductor die(s), a die-to-die offset regarding deviated or shifted semiconductor dies and a via-to-pad overlay shift of the conductive pads 110 and the corresponding conductive vias 120 can be reduced by virtue of the alignment pattern AM1 during the formation of the semiconductor package 20.

Figure 5:
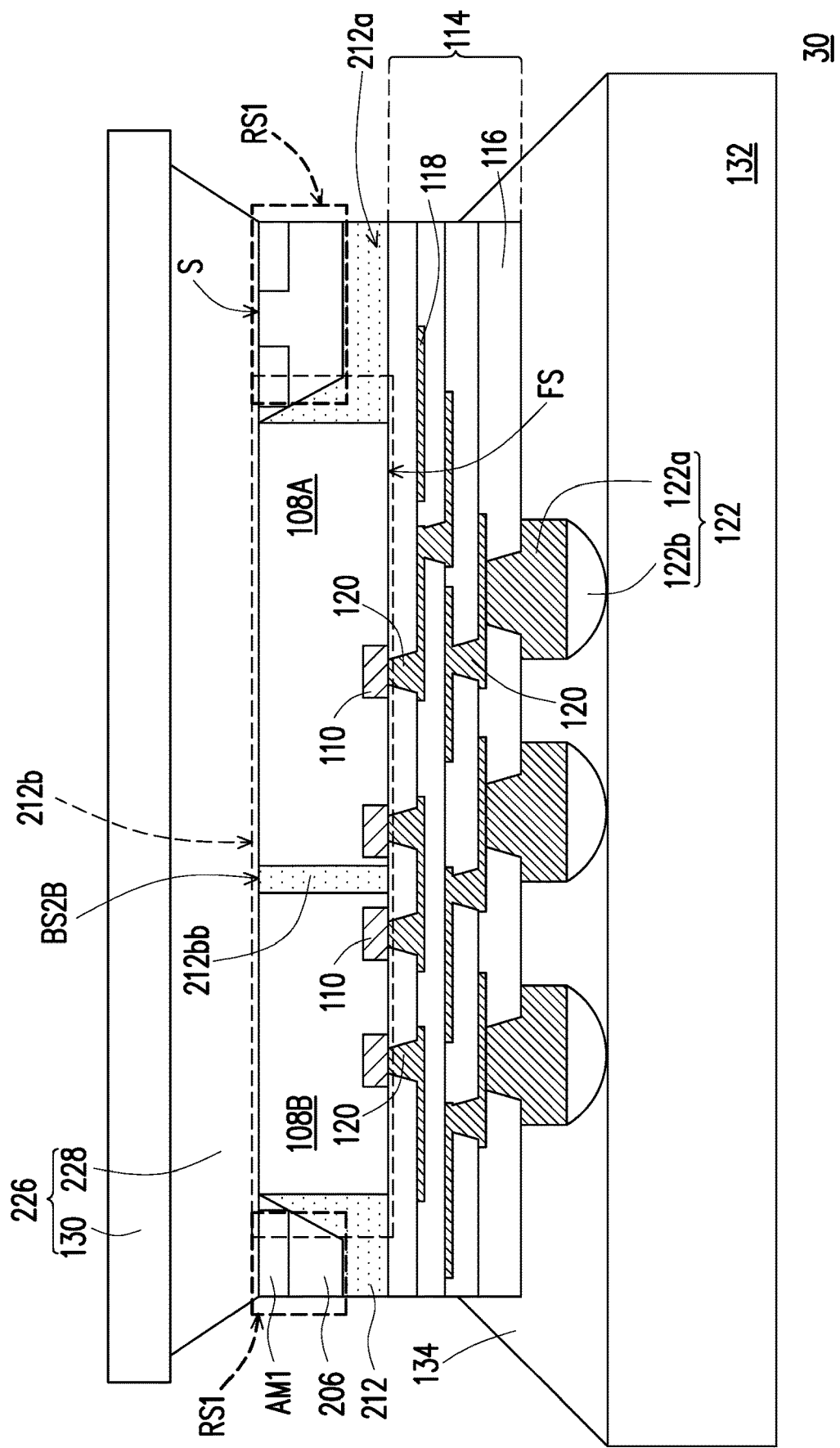
FIG. 5 is a schematic cross-sectional view illustrating a semiconductor package according to some embodiments of the present disclosure.

FIG. 5 is a schematic cross-sectional view illustrating a semiconductor package 30 according to some embodiments of the present disclosure.

Referring to FIG. 4G and FIG. 5, the semiconductor package 30 is similar to the semiconductor package 20 as shown in FIG. 4G. A difference between the semiconductor package 30 with respect to the semiconductor package 20 lies in that a rib structure RS1 in the semiconductor package 30 is not a portion of the thermal interfacial layer 228. The rib structure RS1 is located between the thermal interfacial layer 228 and the body portion 212a of the molding compound 212. In some embodiments, the rib structure RS1 and the thermal interfacial layer 228 of the heat dissipation module 226 are constituted of different materials. Thereby, an interface may exist between the rib structure RS1 and the heat dissipation module 226. In these embodiments, the adhesive layer 206 and the alignment pattern AM1 are partially removed in step S212 (as shown in FIG. 4F). In some embodiments, a planarization process, such as a CMP process or a grinding process, may be performed to partially remove the adhesive layer 206 and the alignment pattern AM1, till a surface S of the remaining portion of the alignment pattern AM1 and a remaining portion of the adhesive layer 206 is coplanar and levelled with the back side BS of the semiconductor dies 108A, 108B. As such, a portion of the adhesive layer 206 and a portion of the alignment pattern AM1 may remain, and form the rib structure RS1. In these embodiments, the alignment pattern AM1 is constituted of a reflective material, and the adhesive layer 206 is constituted of an adhesive material. As such, the rib structure RS1 includes the reflective material and the adhesive material.

In alternative embodiments, the alignment pattern AM1 may be completely removed in step S212 (as shown in FIG. 4F), while the adhesive layer 206 is partially removed. The surface S of the remaining portion of the adhesive layer 205 is coplanar and levelled with the back side BS of the semiconductor dies 108A, 108B. Accordingly, the alignment pattern AM1 may be absent in the rib structure RS1 and the final structure of the semiconductor package 30.

FIG. 6A through FIG. 6I are schematic cross-sectional views illustrating intermediate structures and package structures at various stages following a manufacturing method of semiconductor package 40 according to some embodiments of the present disclosure. The manufacturing method of the semiconductor package 40 is similar with the manufacturing method of the semiconductor package 20, only the difference therebetween will be discussed, the same or similar parts will not be repeated again. In addition, identical or similar components are denoted with the same or similar reference numerals.

Figure 6A:
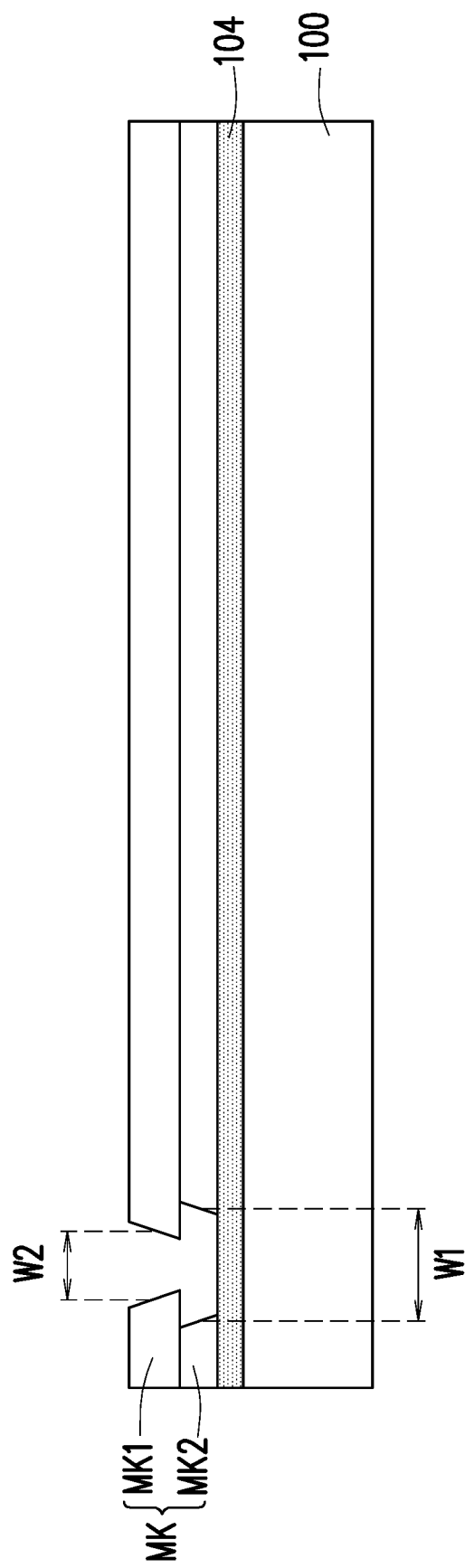
FIG. 6A through FIG. 6I are schematic cross-sectional views illustrating intermediate structures and package structures at various stages following a manufacturing method of semiconductor package according to some embodiments of the present disclosure.

Referring to FIG. 3 and FIG. 6A through FIG. 6C, in step S200, an alignment pattern AM2 is formed on the provided carrier substrate 100. As shown in FIG. 6A, a formation method of the alignment pattern AM2 includes forming a mask pattern MK on the carrier substrate 100. In some embodiments, the de-bonding layer 104 is formed on the carrier substrate 100 before the mask pattern MK is formed. In some embodiments, the mask pattern MK includes a first mask pattern MK1 and a second mask pattern MK2. The first mask pattern MK1 and the second mask pattern MK2 are sequentially stacked on the carrier substrate 100. In some embodiments, the first mask pattern MK1 and the second mask pattern MK2 may be constituted of a photoresist material. A material of the first mask pattern MK1 may be identical to or different from a material of the second mask pattern MK2. A first opening P1 is formed in the first mask pattern MK1, and a second opening P2 is formed in the second mask pattern MK2. The first opening P1 is communicated with the second opening P2. The first opening P1 and the second opening P2 expose the de-bonding layer 104. A width W1 of the first opening P1 is greater than a width W2 of the second opening P2.

Figure 6B:
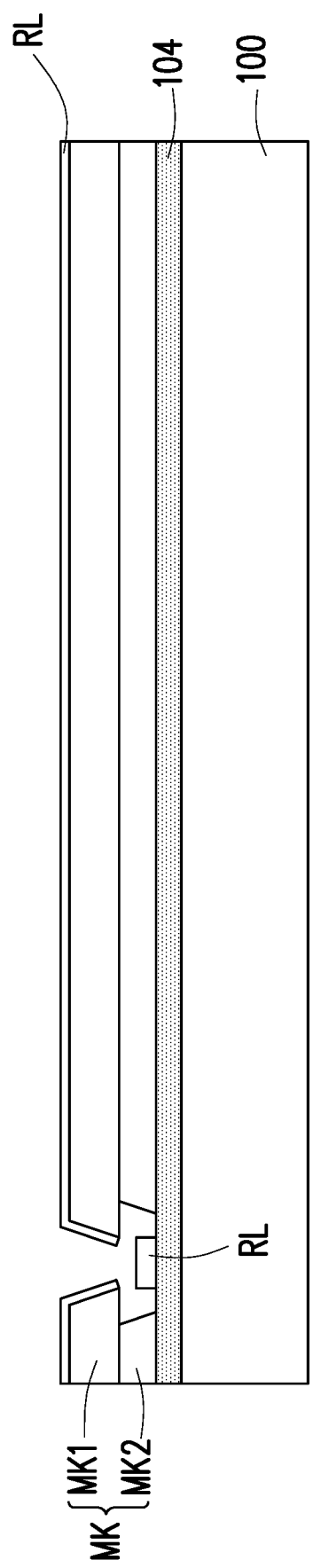

Referring to FIG. 6B, a reflective layer RL is formed on the carrier substrate 100. A first portion of the reflective layer RL covers a top surface of the second mask pattern MK2 and a sidewall of the second opening P2 (i.e., the sidewall of the second mask pattern MK2). A second portion of the reflective layer RL is disposed on a bottom surface of the first opening P1 that is exposed by the second mask pattern MK2. As the second opening P2 is narrower than the first opening P1 located under the second opening P2, a sidewall of the first opening P1 is covered by the second mask pattern MK2. Thereby, the reflective layer RL may not be disposed at the sidewall of the first opening P1. In addition, the second portion of the reflective layer RL on the bottom surface of the first opening P1 may separate from the first portion of the reflective layer RL formed on the top surface and the sidewall of the second mask pattern MK2. In some embodiments, a material of the reflective layer RL may include aluminum, silver, a composite material of copper, a combination thereof or the like.

Figure 6C:
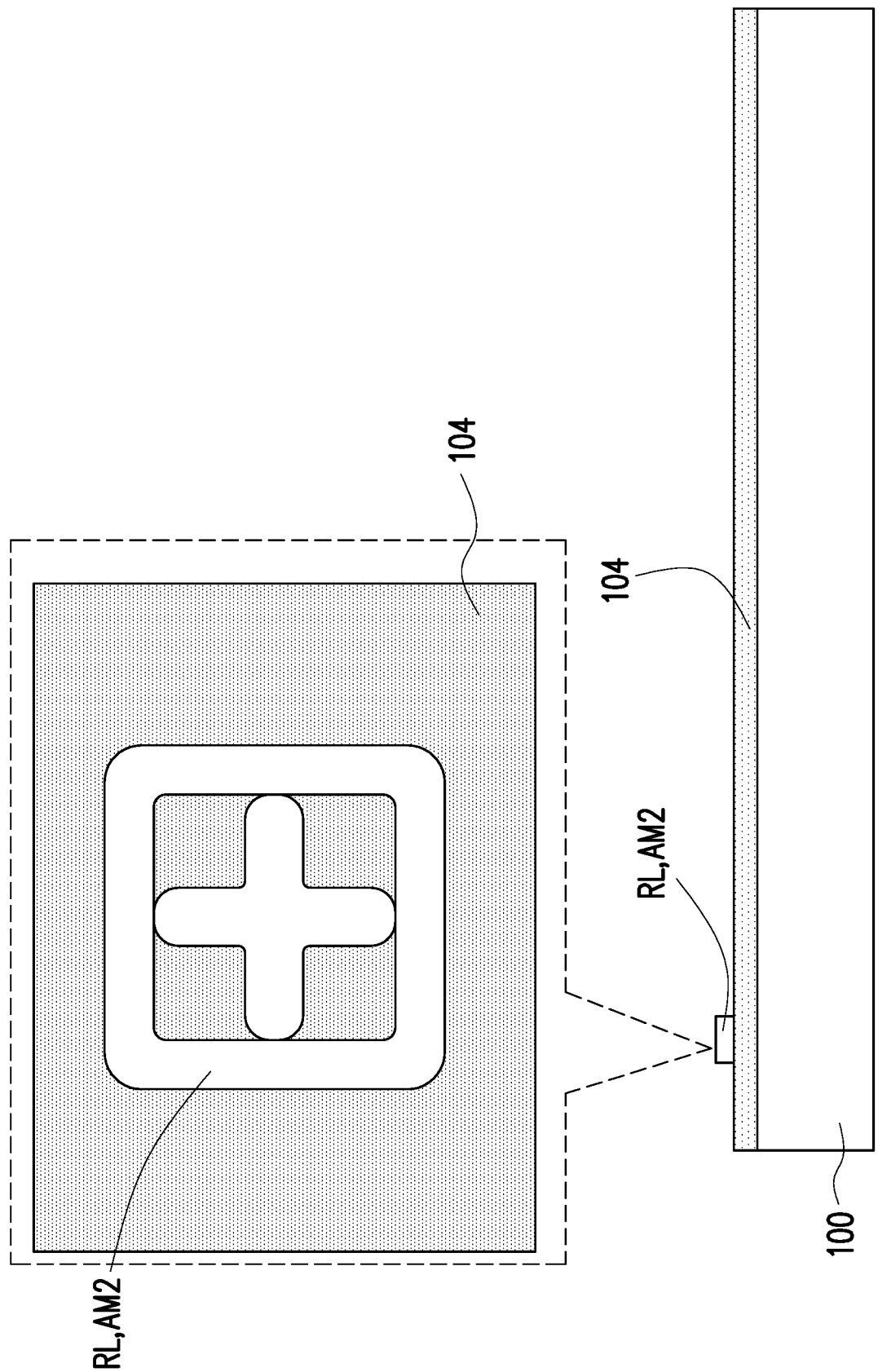

Referring to FIG. 6C, the mask pattern MK and the first portion of the reflective layer RL are removed. A remaining portion of the reflective layer RL (i.e., the second portion of the reflective layer RL) forms the alignment pattern AM2. The region enclosed by a dash line in FIG. 6C shows a schematic top view of the alignment pattern AM2 (i.e., the second portion of the reflective layer RL). In some embodiments, a shape of the top view of the alignment pattern AM2 may include a combination of a cross shape and a rectangular ring. In alternative embodiments, the shape of the top view of the alignment pattern AM2 may include a cross shape, a circular shape, a polygonal shape or a combination thereof. As such, the alignment pattern AM2 can be served as an alignment mark during subsequently performed steps.

Figure 6D:
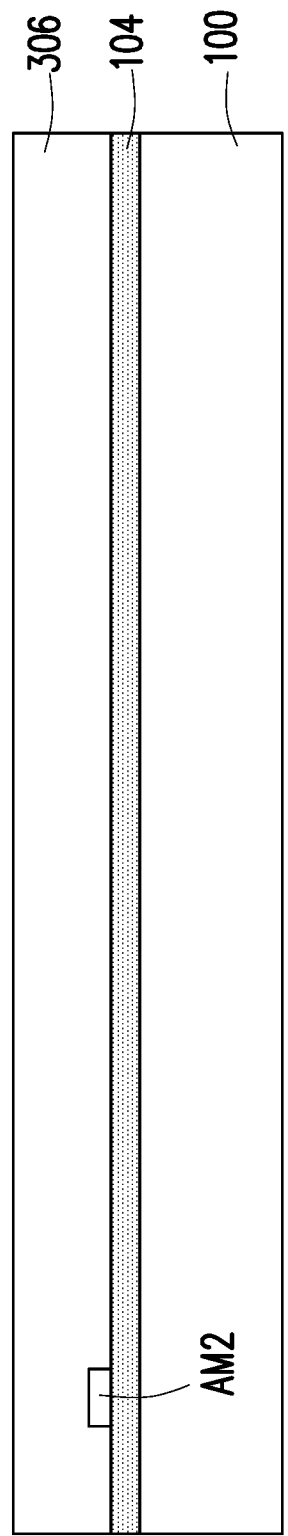

Referring to FIG. 3 and FIG. 6D, step S202 is performed, and an adhesive layer 306 is formed on the carrier substrate 100. In some embodiments, the adhesive layer 306 covers the alignment pattern AM2 and the de-bonding layer 104. In some embodiments, the adhesive layer 306 has a planar top surface.

Figure 6E:
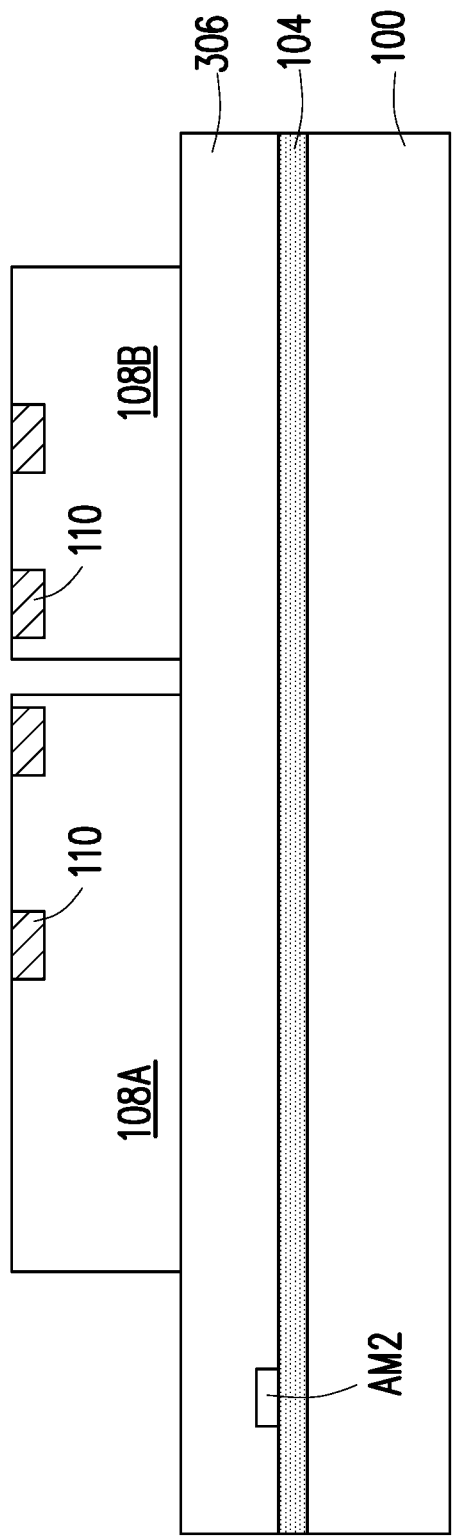

Referring to FIG. 3 and FIG. 6E, step S204 is performed, and the semiconductor dies 108A, 108B are placed on the adhesive layer 306. The semiconductor dies 108A, 108B are placed aside the alignment pattern AM2. The alignment pattern AM2 functions as an alignment mark when positioning each of the semiconductor dies 108. As such, during the placement of the semiconductor dies 108A, 108B, the location shift of the placed semiconductor die(s) is reduced and the positioning accuracy can be improved. In some embodiments, a die-to-die offset (the compensated distance relative to the predetermined desired location) regarding the deviated or shifted semiconductor die can be reduced to 3 μm or less.

Figure 6F:
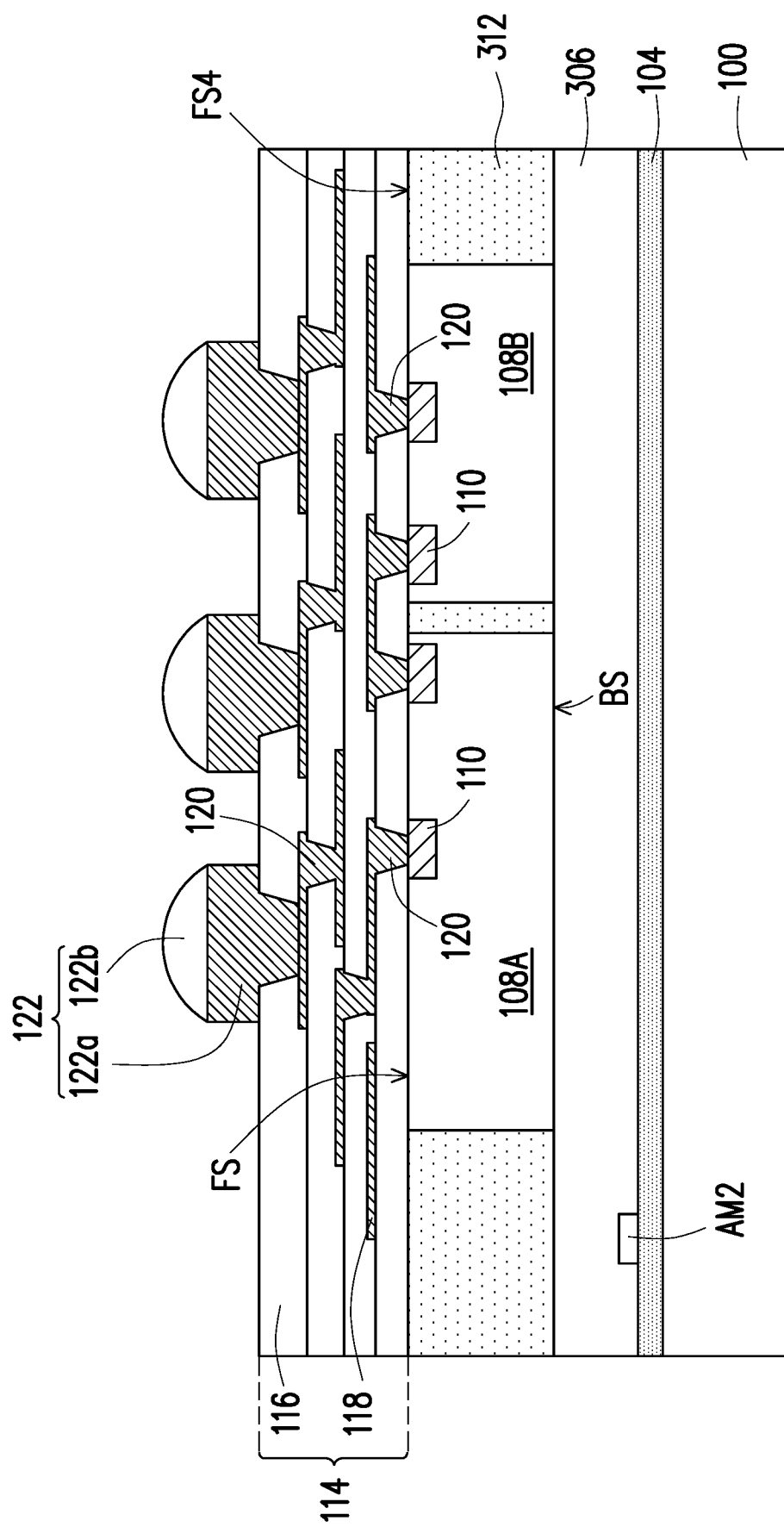

Referring to FIG. 3 and FIG. 6F, step S206 is performed, and a molding compound 312 is formed on the adhesive layer 306. The molding compound 312 surrounds each of the semiconductor dies 108, and exposes the front side FS of the semiconductor dies 108. In some embodiments, a front surface FS4 of the molding compound 312 is coplanar and levelled with the front side FS of the high-power device dies 108. In some embodiments, a thickness of the molding compound 312 is uniform across its cover area.

Step 208 is performed, and the redistribution structure 114 is formed on the front side FS of the semiconductor dies 108A, 108B. The redistribution structure 114 covers the semiconductor dies 108A, 108B and the molding compound 212. In some embodiments, the alignment pattern AM2 also functions as an alignment mark during the formation of the redistribution structure 114. For example, the alignment pattern AM2 can be used as an alignment mark when performing a lithography process for forming the conductive vias 120. With the alignment mark(s), less misalignment for placing the semiconductor dies 108A, 108B and better alignment for forming the conductive via 120 over the conductive pads 110 of the semiconductor dies 108A, 108B are achieved. Thereby, a via-to-pad overlay shift (the deviation distance relative to the predetermined desired location) regarding the conductive pads 110 and the corresponding conductive vias 120 can be reduced to 3 μm or less. In some embodiments, the electrical connectors 122 are formed on the redistribution structure 114.

Figure 6G:
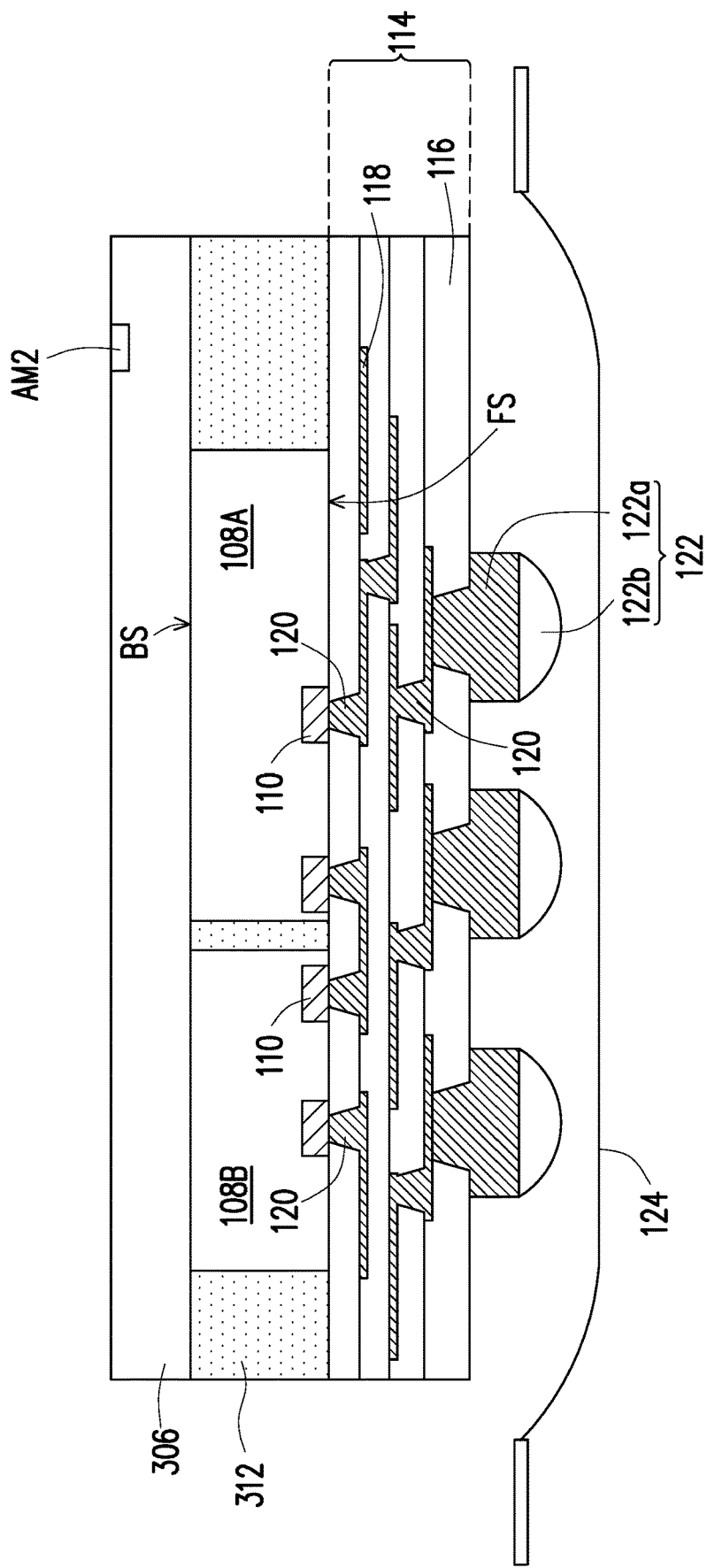

Referring to FIG. 3 and FIG. 6G, step S210 is performed, and the carrier substrate 100 and the de-bonding layer 104 are removed. As such, the adhesive layer 306 and the alignment pattern AM2 are exposed. In some embodiments, the entire structure may be flipped over and attached to a tape 124 before or after the carrier substrate 100 and the de-bonding layer 104 are removed.

Figure 6H:
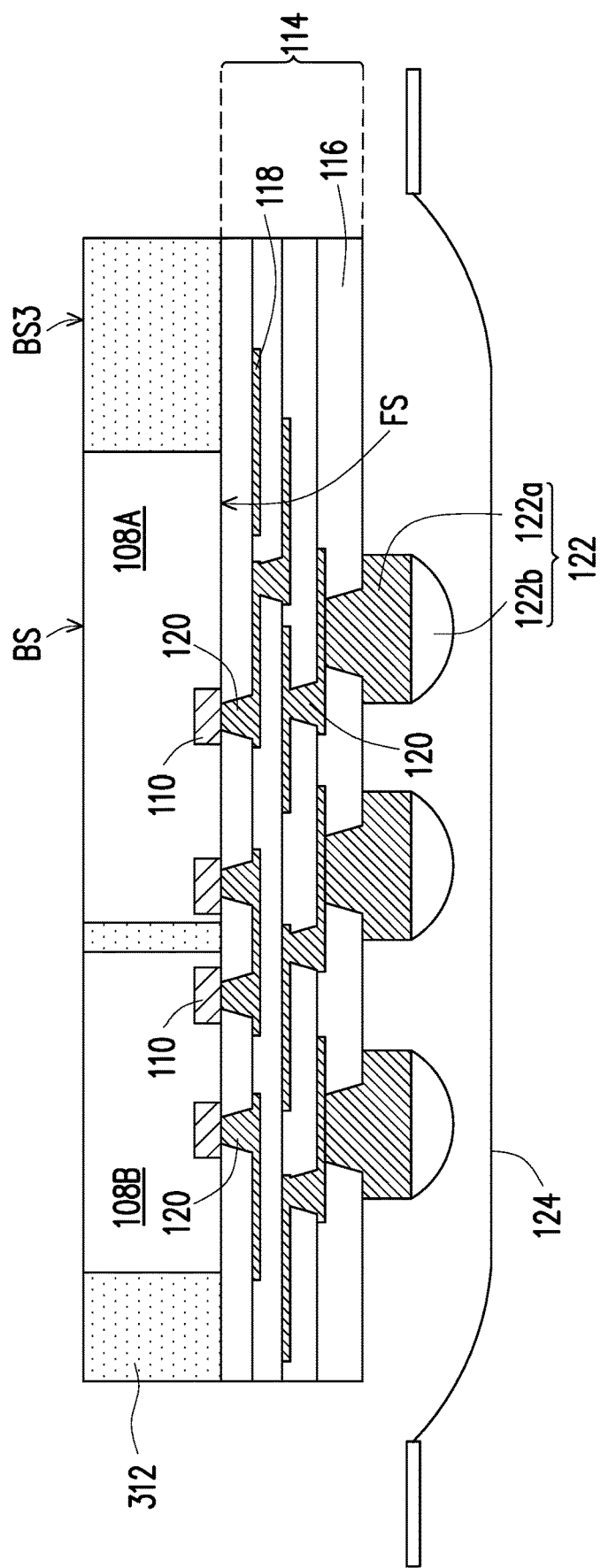

Referring to FIG. 3 and FIG. 6H, step S212 is performed, and the alignment pattern AM2 and the adhesive layer 306 are completely removed. As such, the back side BS of the semiconductor dies 108A, 108B and a back surface BS3 of the molding compound 312 opposite to the redistribution structure 114 are exposed. In some embodiments, a singulation process, such as a sawing process or a cutting process, is performed on the current structure. The singulated structure may contain one or more of the semiconductor dies, and may be referred as a single-die package structure or a multi-die package structure.

Figure 6I:
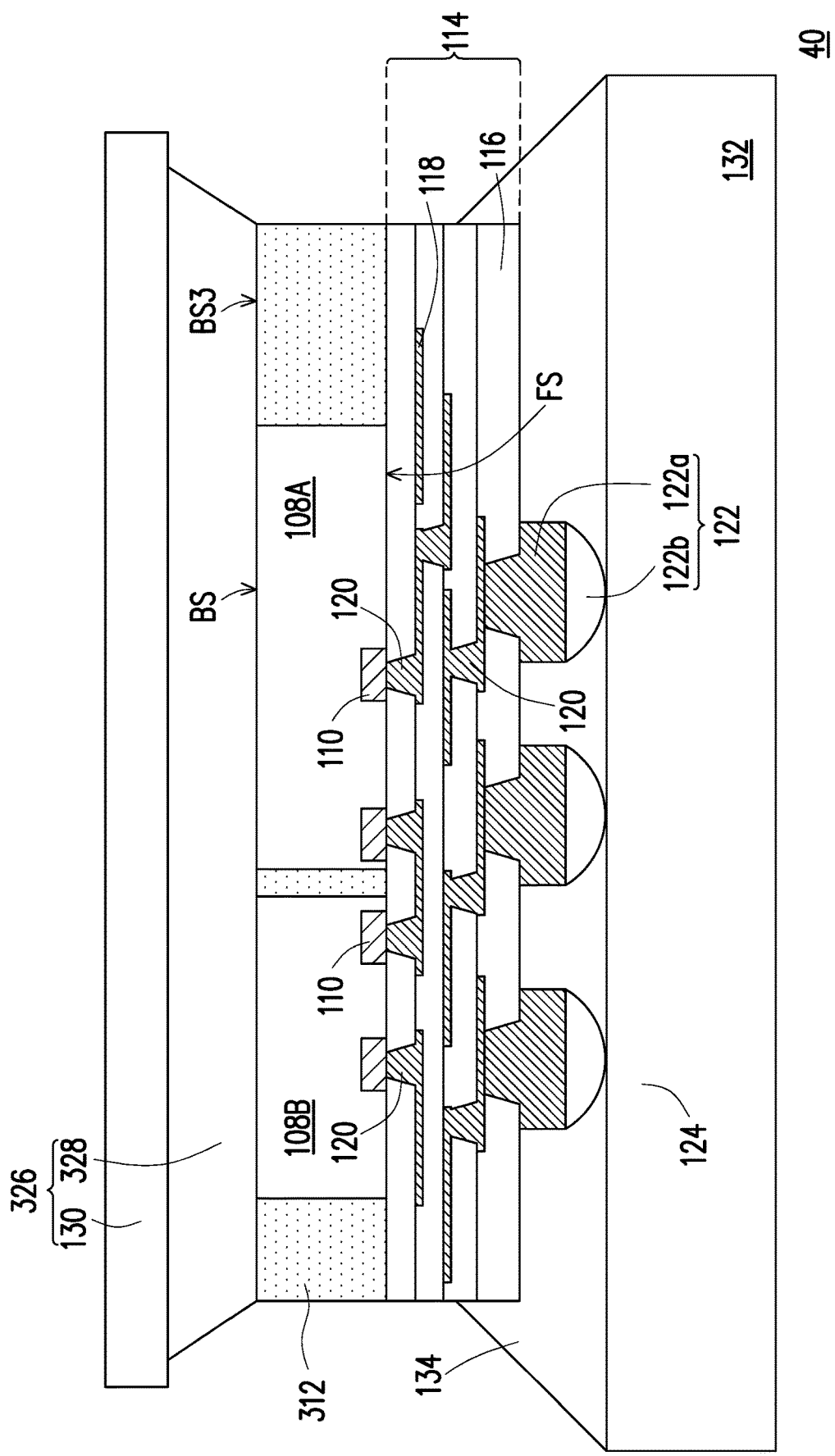

Referring to FIG. 3 and FIG. 6I, step S214 is performed, and the heat dissipation module 326 is formed over the back side BS of the semiconductor dies 108A, 108B. In some embodiments, the formation of the heat dissipation module 326 may include sequentially forming a thermal interfacial layer 328 and providing the lid 130. The thermal interfacial layer 328 is in direct contact with the back side BS of the high-power device dies 108, and located in between the high-power device dies 108 and the lid 130. In addition, the thermal interfacial layer 328 covers the back surface BS3 of the molding compound 312. In some embodiments, a thickness of the thermal interfacial layer 328 is uniform across the back surface BS3 of the molding compound 312 and the back side BS of the high-power device dies 108.

In some embodiments, after the formation of the heat dissipation module 326 and detaching the tape 124, the redistribution structure 114 and the electrical connectors 122 are further mounted to the package substrate 132. As such, the redistribution structure 114 is located in between the high-power device dies 108 and the package substrate 132. In some embodiments, an underfill 134 is formed to fill a space between the redistribution structure 114 and the package substrate 132. In some embodiments, the underfill 134 surrounds each of the electrical connectors 122.

So far, the semiconductor package 40 according to some embodiments has been fabricated. The alignment pattern AM2 has been removed in step S212, such that the alignment pattern AM2 is absent in the final structure of the semiconductor package 40. Even though, a location shift of the placed semiconductor die(s), a die-to-die offset regarding deviated or shifted semiconductor dies and a via-to-pad overlay shift of the conductive pads 110 and the corresponding conductive vias 120 can be reduced by virtue of the alignment pattern AM2 during the formation of the semiconductor package 40.

As above, an alignment mark is formed in or under an adhesive layer before high-power device dies are placed on the adhesive layer. By using the alignment mark during the placement of the high-power device die(s), the location shift of the placed high-power device die(s) can be reduced. In addition, a die-to-die offset regarding the deviated or shift high-power device dies can be reduced. Moreover, when forming a redistribution structure at a front side of the high-power device die(s), a via-to-pad overlay shift regarding the conductive pads in the high-power device die(s) and the corresponding conductive vias in the redistribution structure can be reduced by virtue of the alignment mark as well. As a result, a reliability of electronic devices containing the semiconductor package according to embodiments of the present disclosure can be improved. Moreover, at least a portion of the adhesive layer is removed, such that a heat dissipation module can be directly disposed at the back side of the high-power device dies. As such, a heat path can be directly formed at the back side of the high-power device dies. Therefore, an efficient heat dissipation can be attained in the semiconductor package according to embodiments of the present disclosure.

In an aspect of the present disclosure, a semiconductor package is provided. The semiconductor package comprises: at least one device die, having a front side and a back side opposite to the front side; a redistribution structure, disposed at the front side of the at least one device die; a heat dissipation module, comprising a thermal interfacial layer and a metal lid, wherein the thermal interfacial layer is in direct contact with the back side of the at least one device die, and located between the at least one device die and the metal lid; and a molding compound, disposed between the redistribution structure and the heat dissipation module, and having a body portion and an extended portion, wherein the at least one device die is located in the extended portion, the body portion laterally surrounds the extended portion, and the extended portion is thicker than the body portion.

In another aspect of the present disclosure, a manufacturing method of a semiconductor package is provided. The method comprises: forming an adhesive layer on a carrier substrate; patterning the adhesive layer to form an adhesive pattern having an opening therein; placing at least one device die on the adhesive pattern and aside the opening as using the opening as an alignment mark, wherein the at least one device die has a front side and a back side, the back side faces the adhesive pattern, and the front side is opposite to the back side; forming a molding compound on the adhesive pattern, wherein a body portion of the molding compound surrounds the at least one device die and exposes the front side of the at least one device die, and the molding compound has an extended portion protruding into the opening of the adhesive pattern; forming a redistribution structure on the front side of the at least one device die; removing the carrier substrate and the adhesive pattern; and forming a heat dissipation module at the back side of the at least one device die, wherein the heat dissipation module is in direct contact with the back side of the at least one device die.

In yet another aspect of the present disclosure, a manufacturing method of a semiconductor package is provided. The method comprises: forming an alignment pattern on a carrier substrate; forming an adhesive layer on the carrier substrate, wherein the adhesive layer covers the alignment pattern; placing at least one device die on the adhesive layer as using the alignment pattern as an alignment mark, wherein the at least one device die has a front side and a back side, the back side faces the adhesive layer, and is opposite to the front side; forming a molding compound on the adhesive layer, wherein the molding compound laterally surrounds the at least one device die; forming a redistribution structure on the front side of the at least one device die; removing the carrier substrate; removing at least a portion of the adhesive layer and at least a portion of the alignment pattern; and forming a thermal dissipation module at the back side of the at least one device die, wherein the thermal dissipation module comprises a thermal interfacial layer and a lid, the thermal interfacial layer is in direct contact with the back side of the at least one device die, and the lid is provided on a surface of the thermal interfacial layer that is facing away from the at least one device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of semiconductor package, comprising:
    forming an alignment pattern on a carrier substrate;
    forming an adhesive layer on the carrier substrate, wherein the adhesive layer covers a top surface of the alignment pattern, and the adhesive layer has a recess aside the alignment pattern;
    placing at least one device die in the recess of the adhesive layer as using the alignment pattern as an alignment mark, wherein the at least one device die has a front side and a back side, the back side faces the adhesive layer, and is opposite to the front side, and wherein the alignment pattern remains covered by the adhesive layer during placement of the at least one device die;
    forming a molding compound on the adhesive layer, wherein the molding compound laterally surrounds the at least one device die, and the molding compound has a body portion and an extended portion extending into the recess and laterally surrounded by the body portion;
    forming a redistribution structure on the front side of the at least one device die;
    removing the carrier substrate;
    removing at least a portion of the adhesive layer and at least a portion of the alignment pattern; and
    forming a thermal dissipation module at the back side of the at least one device die, wherein the thermal dissipation module comprises a thermal interfacial layer and a lid, the thermal interfacial layer is in direct contact with the back side of the at least one device die, and the lid is provided on a surface of the thermal interfacial layer that is facing away from the at least one device die.

2. The manufacturing method of semiconductor package of claim 1, wherein the step of forming the alignment pattern on the carrier substrate comprises:
    forming a dielectric layer on the carrier substrate; and
    patterning the dielectric layer to form the alignment pattern.

3. The manufacturing method of semiconductor package of claim 1, wherein after placement of the at least one device die, the at least one device die has a top portion protruded with respect to a topmost surface of the adhesive layer.

4. The manufacturing method of semiconductor package of claim 1, wherein the extended portion is thicker than the body portion.

5. The manufacturing method of semiconductor package of claim 1, wherein the adhesive layer and the alignment pattern are completely removed during the step of removing the at least a portion of the adhesive layer and the at least a portion of the alignment pattern.

6. The manufacturing method of semiconductor package of claim 1, wherein the thermal interfacial layer is also in direct contact with the extended portion and the body portion of the molding compound.

7. The manufacturing method of semiconductor package of claim 1, wherein the thermal interfacial layer has a first portion and a second portion, the first portion is overlapped with the body portion of the molding compound, the second portion is overlapped with the extended portion of the molding compound, and the first portion is thicker than the second portion.

8. The manufacturing method of semiconductor package of claim 1, wherein the adhesive layer and the alignment pattern are partially removed till an exposed surface of a remaining portion of the alignment pattern is coplanar with the back side of the at least one device die during the step of removing the at least a portion of the adhesive layer and the at least a portion of the alignment pattern.

9. The manufacturing method of semiconductor package of claim 8, wherein a first portion of the thermal interfacial layer overlapped with the body portion and a second portion of the thermal interfacial layer overlapped with the extended portion of the molding compound have the same thickness.

10. The manufacturing method of semiconductor package of claim 8, the remainder portion of the adhesive layer and the alignment pattern laterally surrounds the at least one device die, and are located between the thermal interfacial layer and the molding compound.

11. A manufacturing method of semiconductor package, comprising:
    forming an alignment pattern on a carrier substrate;
    forming an adhesive layer on the alignment pattern and the carrier substrate, wherein a first portion of the adhesive layer lying on the alignment pattern is lifted with respect to a second portion of the adhesive layer spanning aside the alignment pattern;

placing a device die on the second portion of the adhesive layer as using the alignment pattern as an alignment mark, wherein the alignment pattern is remained covered by the first portion of the adhesive layer during placement of the device die;

laterally encapsulating the device die by a molding compound;

forming a redistribution structure on the device die and the molding compound;

removing the carrier substrate;

completely removing the adhesive layer and the alignment pattern to expose a surface of the device die and a surface of the molding compound;

providing a thermal dissipation module at the exposed surfaces of the device die and the molding compound.

12. The manufacturing method of semiconductor package of claim 11, wherein the second portion of the adhesive layer is surrounded by the first portion of the adhesive layer.

13. The manufacturing method of semiconductor package of claim 11, wherein the molding compound covers the first and second portions of the adhesive layer before removal of the adhesive layer.

14. The manufacturing method of semiconductor package of claim 13, wherein a portion of the molding compound overlapped with the second portion of the adhesive layer is thicker than another portion of the molding compound overlapped with the first portion of the adhesive layer.

15. A manufacturing method of semiconductor package, comprising:

forming an alignment pattern on a carrier substrate, wherein the alignment pattern is a material pattern lying on a top surface of the carrier substrate;

forming an adhesive layer on the alignment pattern and the carrier substrate, wherein the adhesive layer has a recess aside the alignment pattern;

placing a device die in the recess of the adhesive layer as using the alignment pattern as an alignment mark, wherein the placed device die is located aside the alignment pattern, the alignment pattern is remained covered by the adhesive layer during placement of the device die;

laterally encapsulating the device die by a molding compound, wherein the molding compound has a body portion and an extended portion extending into the recess and laterally surrounded by the body portion;

forming a redistribution structure on the device die and the molding compound;

removing the carrier substrate;

completely removing the adhesive layer and the alignment pattern to expose a surface of the device die and a surface of the molding compound;

providing a thermal dissipation module at the exposed surfaces of the device die and the molding compound.

16. The manufacturing method of semiconductor package of claim 15, wherein the alignment pattern has separated portions, and the recess of the adhesive layer formed over the alignment pattern and the carrier substrate is located between the separated portions of the alignment pattern.

17. The manufacturing method of semiconductor package of claim 16, wherein the body portion is overlapped with the separated portions of the alignment pattern before removal of the adhesive layer and the alignment pattern, and the extended portion extends from a bottom surface of the recess to a height substantially levelled with the front side of the at least one device die.

18. The manufacturing method of semiconductor package of claim 17, wherein the body portion has a surface substantially levelled with the front side of the at least one device die.

19. The manufacturing method of semiconductor package of claim 17, wherein a sidewall of the recess is covered by the extended portion of the molding compound.

20. The manufacturing method of semiconductor package of claim 17, wherein the at least one device die comprises a first device die and a second device die, the first and second device dies are laterally spaced apart from each other, and the extended portion of the molding compound fills a space between the first and second device dies.

* * * * *